United States Patent
Hatakeyama et al.

(10) Patent No.: US 9,310,681 B2
(45) Date of Patent: Apr. 12, 2016

(54) NEGATIVE RESIST COMPOSITION AND PATTERNING PROCESS USING SAME

(71) Applicant: SHIN-ETSU CHEMICAL CO., LTD., Tokyo (JP)

(72) Inventors: Jun Hatakeyama, Jyoetsu (JP); Hiroyuki Urano, Jyoetsu (JP); Masashi Iio, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/564,764

(22) Filed: Dec. 9, 2014

(65) Prior Publication Data
US 2015/0198883 A1  Jul. 16, 2015

(30) Foreign Application Priority Data
Jan. 10, 2014  (JP) ................................. 2014-003194

(51) Int. Cl.
| | | |
|---|---|---|
| *G03F 7/038* | (2006.01) | |
| *G03F 7/30* | (2006.01) | |
| *G03F 7/40* | (2006.01) | |
| *H01L 21/027* | (2006.01) | |
| *C08G 8/28* | (2006.01) | |

(52) U.S. Cl.
CPC ............... *G03F 7/0384* (2013.01); *C08G 8/28* (2013.01); *G03F 7/30* (2013.01); *G03F 7/40* (2013.01); *H01L 21/0274* (2013.01)

(58) Field of Classification Search
CPC ....... G03F 7/0382; G03F 7/0834; G03F 7/30; G03F 7/40; H01L 21/0271; H01L 21/0274; C08G 8/28
USPC .............. 430/270.1, 434, 435, 322, 325, 329, 430/330, 331, 927
See application file for complete search history.

(56) References Cited

U.S. PATENT DOCUMENTS

| | | | | | |
|---|---|---|---|---|---|
| 4,046,577 | A | * | 9/1977 | Muzyczko | ............... G03F 7/027 101/456 |
| 4,578,438 | A | * | 3/1986 | Demmer | ................... C08G 8/38 524/595 |
| 4,681,923 | A | * | 7/1987 | Demmer | ................... C08G 8/28 204/478 |
| 4,839,253 | A | * | 6/1989 | Demmer | ................... C08G 8/28 204/478 |
| 5,100,989 | A | * | 3/1992 | Uhrig | ....................... A01N 25/30 527/602 |
| 5,512,063 | A | * | 4/1996 | Kruse | ................... D06P 1/5207 8/532 |
| 6,391,519 | B1 | * | 5/2002 | Kunita | ................... B41C 1/1008 430/270.1 |
| 2008/0090172 | A1 | | 4/2008 | Hatakeyama et al. | |
| 2008/0118860 | A1 | | 5/2008 | Harada et al. | |
| 2008/0153030 | A1 | | 6/2008 | Kobayashi et al. | |
| 2008/0241736 | A1 | | 10/2008 | Kobayashi et al. | |
| 2010/0113678 | A1 | * | 5/2010 | Suzuki | .................... C08L 61/06 524/541 |

FOREIGN PATENT DOCUMENTS

| | | | | |
|---|---|---|---|---|
| JP | B2-3790649 | | 6/2006 | |
| JP | A-2008-111103 | | 5/2008 | |
| JP | A-2008-122932 | | 5/2008 | |
| JP | A-2008-158339 | | 7/2008 | |
| JP | A-2008-239918 | | 10/2008 | |
| JP | 2007-233395 A | * | 9/2013 | .............. G03F 7/038 |

OTHER PUBLICATIONS

Maenhoudt et al., "Double Patterning Scheme for Sub-0.25 k1 Single Damascene Structures at NA=0.75, λ=193nm," *Proceedings of SPIE*, 2005, vol. 5754, pp. 1508-1518.

* cited by examiner

*Primary Examiner* — Amanda C Walke
(74) *Attorney, Agent, or Firm* — Oliff PLC

(57) ABSTRACT

A negative resist composition containing as base resin a novolak resin having repeating unit "a",

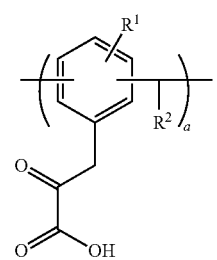

(1)

wherein $R^1$ represents a hydrogen atom, a hydroxy group, or any of a linear, a branched, or a cyclic alkyl group, alkoxy group, acyl group, acyloxy group, and alkoxycarbonyl group, these groups having 1 to 6 carbon atoms; and $R^2$ represents a hydrogen atom, any of a linear, a branched, or cyclic alkyl group having 1 to 6 carbon atoms, alkenyl group having 2 to 10 carbon atoms, aryl group having 6 to 10 carbon atoms, which may contain a hydroxy group, an alkoxy group, an ether group, a thioether group, a carboxyl group, an alkoxy carbonyl group, and an acyloxy group. "A" is within the range of $0 < a \leq 1$. A negative resist composition, a chemically amplified resist composition, having a high resolution, pattern profile after exposure, and high durability as a permanent film.

12 Claims, No Drawings

NEGATIVE RESIST COMPOSITION AND PATTERNING PROCESS USING SAME

BACKGROUND OF THE INVENTION

1. Field of the Invention

The present invention relates to a negative resist composition, especially a negative resist composition using a polymer suitable as a base resin of a chemically amplified negative resist composition, and also to a patterning process.

2. Description of the Related Art

As the LSI advances toward a higher integration and a faster processing speed, miniaturization of a pattern rule is progressing rapidly. Especially expansion of a flash memory market and increase in a memory capacity are towing miniaturization thereof. The 20-nm node device is mass-produced by the double patterning using the ArF lithography as the most advanced miniaturization technology (Non-Patent Document 1).

However, the EUV exposure technology, which is receiving a high expectation as the next generation exposure technology, has a low throughput due to the low output power of a laser beam, so that application thereof to the mass production has not been realized yet. The multi-beam EB has a problem that controllability of each beam is not clear yet, so that an investigation is being carried out on the quadruple patterning in which the double patterning with the ArF exposure is repeated twice: however, this becomes an extremely expensive process. As mentioned above, miniaturization of the pattern rule appears to be approaching to its end from the viewpoints of the technology and the economy.

On the other hand, an investigation is being carried out to enhance the integration degree by stacking the transistors vertically. In the flash memory, a device having a configuration of the laminated films through which the vertical gate is pierced is being investigated. In this case, the integration degree is determined by the number of the laminated films; and thus, enhancement of the integration degree can be achieved without depending on the miniaturization. Development of the miniaturization has been carried out with the aim not only to seek high performances including the increase in the processing speed of the device but also rather to improve the productivity and to cut the cost by increasing the number of the chips that can be obtained from one wafer. In the method to enhance the integration degree by increasing the number of the laminated films as mentioned above, the cost becomes higher as the integration degree is made higher; and thus, in the economic view point this method is different from the way with which the integration degree is enhanced by promoting the miniaturization. Moreover, in this method, there are technical problems in the way to form the myriad laminated films without a defect as well as in the way to form the vertical gate with a high precision. Accordingly, there exist technical and economic difficulties in the vertical transistor as well.

Besides, the 3D-IC in which the memory and the logic are mounted together on one chip is being investigated. By this 3D-IC technology, one chip mounted with multiple functions can be formed. In the movement from a smartphone, which is a main stream today, to a wearable information terminal, development of an extremely small-sized multifunctional chip is assumed to be essential.

As the method to form the 3D-IC, a method to connect the memory with the logic by a bump or a silicon interposer is generally used. In this method, however, the memory and the logic are arranged side by side, so that this does not bring about significant reduction in the chip size. On the other hand, the method in which the logic and the memory are laminated and connected by means of a through electrode (TSV: through-silicon via) whereby communicating between them can bring about significant reduction in the chip size.

For patterning the silicon interposer and the TSV, a thick resist film is used. This thick resist film remains as an insulation film after patterning, so that this is required to have a high durability.

PRIOR ART DOCUMENT

Non-Patent Document

Non-Patent Document 1: Proc. SPIE Vol. 5754, p. 1508 (2005)

SUMMARY OF THE INVENTION

The present invention was made in view of the problems as mentioned above; and thus, the present invention has an object to provide a negative resist composition, especially a chemically amplified negative resist composition, having a higher resolution than conventional resist compositions of a hydroxy styrene type and a novolak type, an excellent pattern profile after exposure, and a high durability as a permanent film, and also to provide a patterning method by using this composition.

In order to solve the problems as mentioned above, the present invention provides a negative resist composition having as a base resin thereof a novolak resin containing repeating unit "a" shown by the following general formula (1),

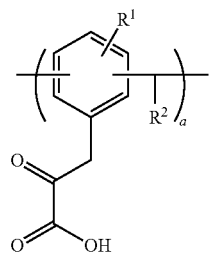

(1)

wherein $R^1$ represents a hydrogen atom, a hydroxy group, or any of a linear, a branched, or a cyclic alkyl group, alkoxy group, acyl group, acyloxy group, and alkoxy carbonyl group, these groups having 1 to 6 carbon atoms; and $R^2$ represents a hydrogen atom, or any of a linear, a branched, or a cyclic alkyl group having 1 to 6 carbon atoms, an alkenyl group having 2 to 10 carbon atoms, or an aryl group having 6 to 10 carbon atoms, wherein these groups may optionally contain a hydroxy group, an alkoxy group, an ether group, a thioether group, a carboxyl group, an alkoxy carbonyl group, and an acyloxy group. In this, "a" is within the range of $0 < a \leq 1$.

The negative resist composition like this has a high dissolution contrast, so that it has a higher resolution than conventional negative resist compositions of a hydroxy styrene type and a novolak type; and in addition, it has a good pattern profile after exposure as well as a high durability as a permanent film by making it hydrophobic by baking after patterning.

In addition, it is preferable that the novolak resin further contain repeating unit "b1" as shown by the following general formula (2),

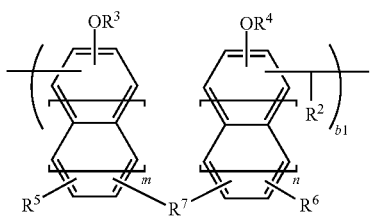

(2)

wherein $R^2$ represents the same meaning as before. $R^3$ and $R^4$ represent a hydrogen atom, or any of a linear, a branched, or a cyclic alkyl group or acyl group having 1 to 6 carbon atoms; and $R^5$ and $R^6$ represent a hydrogen atom, or any of a linear, a branched, or a cyclic alkyl group having 1 to 6 carbon atoms, wherein these groups may be optionally substituted by a halogen atom partially or all of them. $R^7$ represents a single bond, or any of a linear, a branched, or a cyclic alkylene group having 1 to 20 carbon atoms, or a linear, a branched, or a cyclic alkenylene group having 2 to 20 carbon atoms, or an arylene group having 6 to 20 carbon atoms, wherein these groups may optionally contain a nitrogen atom, a hydroxy group, a carboxyl group, an alkoxy carbonyl group, an acyloxy group, an ether group, an ester group, a thioether group, or a lactone ring. $R^5$ and $R^6$ may be optionally bonded to form an ether ring. Here, "m" and "n" each represents 0 or 1; and "b1" is within the range of $0<b1<1$.

In addition, it is preferable that the novolak resin further contain repeating unit "b2" as shown by the following general formula (3),

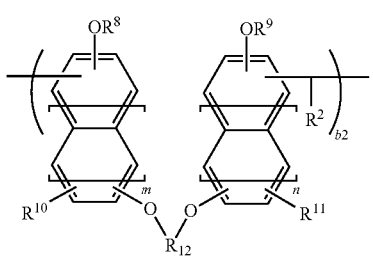

(3)

wherein $R^2$ represents the same meaning as before. $R^8$ and $R^9$ represent a hydrogen atom, or any of a linear, a branched, or a cyclic alkyl group or acyl group having to 6 carbon atoms; $R^{10}$ and $R^{11}$ represent a hydrogen atom, or any of a linear, a branched, or a cyclic alkyl group having 1 to 6 carbon atoms; and $R^{12}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group. Here, "m" and "n" each represents 0 or 1; and "b2" is within the range of $0<b2<1$.

In addition, it is preferable that the novolak resin further contain repeating unit "b3" as shown by the following general formula (4),

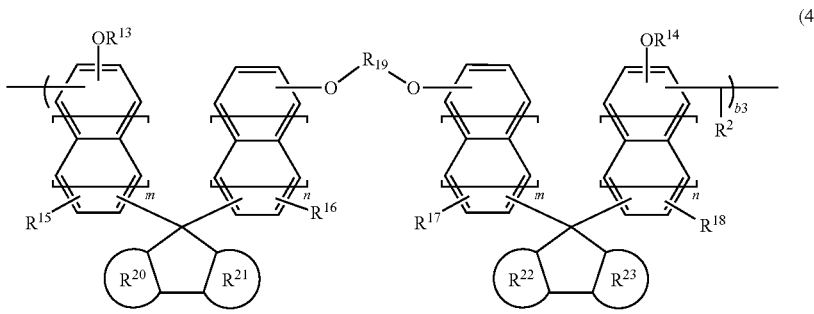

(4)

wherein $R^2$ represents the same meaning as before. $R^{13}$ and $R^{14}$ represent a hydrogen atom, or any of a linear, a branched, or a cyclic alkyl group or acyl group having 1 to 6 carbon atoms; $R^{15}$ to $R^{18}$ represent a hydrogen atom, or any of a linear, a branched, or a cyclic alkyl group having 1 to 6 carbon atoms; and $R^{19}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group. $R^{20}$ to $R^{23}$ represent a benzene ring or a naphthalene ring. Here, "m" and "n" each represents 0 or 1; and "b3" is within the range of $0<b3<1$.

If the novolak resin contains these repeating units "b1" to "b3", the film obtained therefrom is provided with a heat resistance after patterning and also with an effect of the stress relaxation to suppress warping of a wafer caused by the stress of the film.

In addition, the weight-average molecular weight of the novolak resin is preferably in the range of 400 to 500,000.

If the weight-average molecular weight of the novolak resin is in the range of 400 to 500,000, in view of both the dissolution contrast and the acid diffusion, optimization may be made.

It is preferable that the negative resist composition of the present invention be a chemically amplified resist composition which contains an acid-generator.

If the negative resist composition of the present invention contains an acid-generator as mentioned above, this composition may be used suitably as a chemically amplified resist composition.

In addition, it is preferable that the negative resist composition of the present invention contain any one or more selected from an organic solvent, a basic compound, a dissolution controlling agent, a surfactant, and a crosslinking agent.

By blending an organic solvent as mentioned above, a coating property of the resist composition onto a substrate or the like may be improved. By blending a basic compound, the diffusion rate of an acid in the resist film can be suppressed, so that the resolution may be enhanced further more. By blending a dissolution controlling agent, the difference in dissolution rates between the exposed area and the unexposed area may be accentuated further more so that the resolution may be enhanced further more. By blending a surfactant, the coating property of the resist composition can be enhanced further more or controlled more readily. By blending a crosslinking agent, the resolution may be enhanced further more.

In addition, the present invention provides a patterning process wherein the patterning process comprises a step of applying the negative resist composition onto a substrate, after a heat treatment thereof, a step of exposing thereof to a high energy beam, and a step of development thereof by using a developer.

By using the patterning process as mentioned above, a micro pattern can be formed readily.

In addition, the present invention provides a patterning process wherein a step of baking is further included after a pattern is formed by the patterning process.

According to the patterning process as mentioned above, the film may be made to be hydrophobic, so that stability of the film under the environment of high temperature and high humidity may be enhanced, whereby this film may be made to be a permanent film having a high durability.

As explained above, the negative resist composition of the present invention may be suitably used as a chemically amplified resist composition having high sensitivity and resolution, and showing a good pattern profile after exposure with a suppressed acid diffusion rate and with an excellent etching resistance. In addition, the film which uses the negative resist composition of the present invention has the heat resistance and the stress relaxation effect. According to the patterning process using the resist composition as mentioned above, a micro pattern can be formed readily. Furthermore, the film may have hydrophobicity by baking it after patterning, so that the stability of the film under the environment of high temperature and high humidity may be enhanced, whereby the film may be made to be a permanent film with a high durability.

DESCRIPTION OF THE PREFERRED EMBODIMENTS

Hereunder, embodiments of the present invention will be explained; however, the present invention is not limited to these embodiments.

Inventors of the present invention carried out an extensive investigation to obtain a negative resist composition having high sensitivity and resolution with a good exposure margin, a good etching profile, an excellent etching resistance, and a high stability of a film after patterning, these characteristics being required in recent years.

In order to enhance the dissolution contrast, inventors of the present invention considered at first to use a novolak resist having a carboxyl group which has a high acidity thereby providing it with a rapid dissolution rate into an alkaline solution. As to the interlayer insulation film to laminate chips, the durable insulation and adhesion properties under the environment of high temperature and high humidity for a long period of time are required. In order to enhance the stability of the film after patterning, especially to enhance the stability of the film under the environment of high temperature and high humidity, it is preferable not to have a hydrophilic group therein. On the other hand, in order to enhance the dissolution contrast during the alkaline development, a dissoluble group having a high acidity such as a carboxyl group needs to be present.

As to an aromatic compound having a carboxyl group, hydroxy benzoic acid and hydroxy naphthoic acid may be mentioned. By copolymerizing the compounds like these, a high dissolution contrast can be obtained. However, if the carboxyl group is present in the film after patterning, the film changes in its properties under the environment of high temperature and high humidity, whereby causing deterioration of adhesion with a substrate along with other undesirable effects. Accordingly, it is preferable that the carboxyl group be not present if the film is intended to be preserved as the permanent film after patterning. In order to obtain a material having contradicting properties, that is, a high dissolution rate in an alkaline solution and a high stability after patterning, the inventors of the present invention came to an idea to have a material whose carboxyl group disappears by baking after patterning. The decarbonation reaction, the phenomenon that a carboxyl group disappears by heating if an electron withdrawing group is present at the α-position of the carbonyl group, is a well-known reaction. By taking advantage of this property, inventors of the present invention considered that the afore-mentioned characteristics might be realized by using as the base resin the novolak resin that is obtained by condensation of an aldehyde with a phenol compound having a pyruvic acid, which is the compound having a carbonyl group at the next to the carboxyl group.

Therefore, inventors of the present invention used the novolak resin having the repeating unit of a phenyl pyruvic acid as the base resin of the negative resist composition, especially the chemically amplified resist composition; and then, they found that the negative resist composition, especially the chemically amplified resist composition, having high sensitivity and resolution with a good pattern profile after exposure and an excellent etching resistance, and thus being suitably usable as a material for manufacturing of a VLSI or for micropatterning of a photomask, could be obtained. Based on this finding, the present invention could be accomplished.

That is, the present invention provides a negative resist composition having a novolak resin as the base resin thereof, wherein the novolak resin contained in the negative resist composition has repeating unit "a" shown by the following general formula (1),

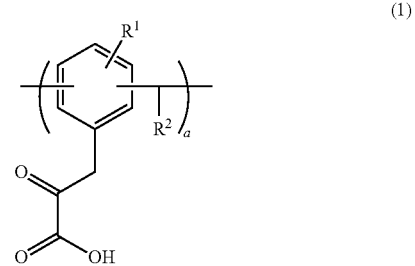

(1)

wherein $R^1$ represents a hydrogen atom, a hydroxy group, or any of a linear, a branched, or a cyclic alkyl group, alkoxy group, acyl group, acyloxy group, and alkoxy carbonyl group, these groups having 1 to 6 carbon atoms; and $R^2$ represents a hydrogen atom, or any of a linear, a branched, or a cyclic alkyl group having 1 to 6 carbon atoms, an alkenyl group having 2 to 10 carbon atoms, or an aryl group having 6 to 10 carbon atoms, wherein these groups may optionally contain a hydroxy group, an alkoxy group, an ether group, a thioether group, a carboxyl group, an alkoxy carbonyl group, and an acyloxy group. In this, "a" is within the range of 0<a≤1.

The negative resist composition of the present invention has a high dissolution contrast, so that a high sensitivity and a high resolution can be obtained in exposure to a high energy beam. In addition, this composition has an exposure margin with an excellent process adaptability and a good pattern profile after exposure; and moreover, it has an especially small size difference between a dense pattern and a sparse pattern, and a further excellent etching resistance. Because of these superior characteristics, this composition is extremely useful as the material for manufacturing of a VLSI or for micropatterning of a photomask.

In addition, in the negative resist composition of the present invention, by changing the ratio of the repeating unit "a" of the phenyl pyruvic acid, the dissolution rate of the polymer into an alkaline solution can be adjusted, so that the negative resist composition having an appropriate dissolution rate into an alkaline solution depending on the situation may be obtained. That is, if the ratio of the repeating unit "a" is made higher, the dissolution rate of the unexposed area into the alkaline developer may be made faster, so that the dissolution contrast may be enhanced. On the other hand, if the ratio of the repeating unit "a" is made lower by adding other repeating units, the dissolution rate into the alkaline solution can be made slower by the crosslinking reaction, so that a sufficient film thickness of the pattern may be obtained after the development.

On the contrary, if the repeating unit "a" is not contained therein, the rate into the alkaline solution is so slow that there is a risk not to form a pattern because of the insufficient dissolution contrast.

Specific example of the phenyl pyruvic acid shown by the general formula (1) includes the following compounds.

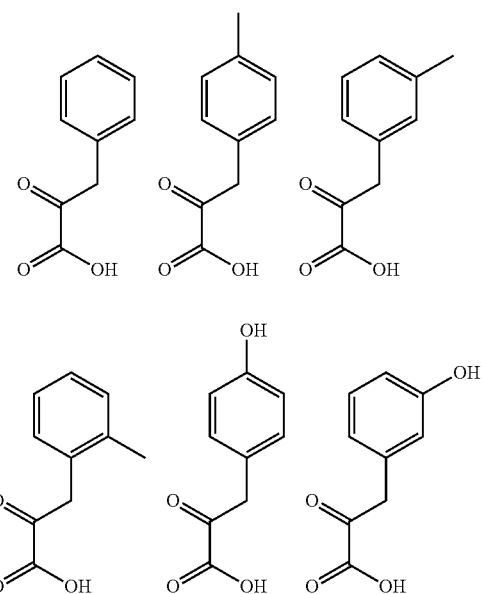

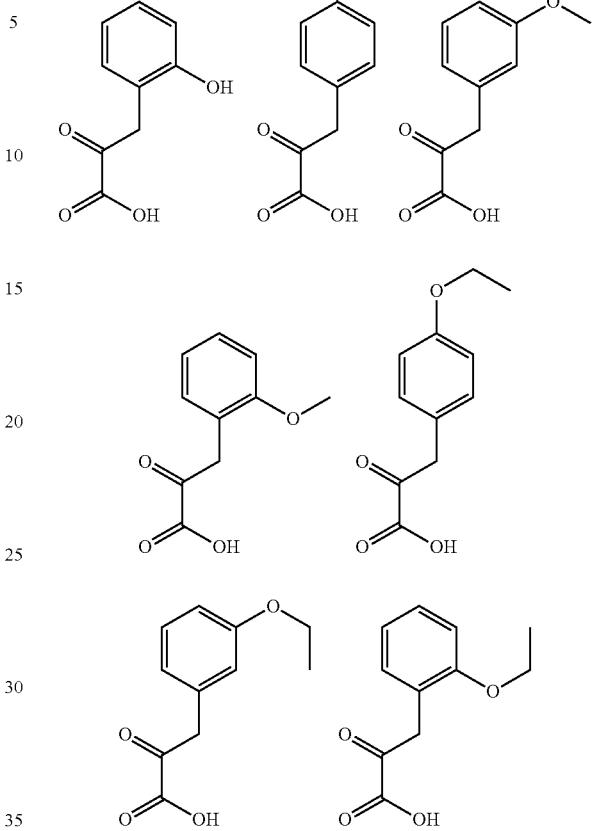

Among these compounds, a hydroxy or an alkoxy phenyl pyruvic acid may be preferably used.

The present invention is the negative resist having the novolak resin of a phenyl pyruvic acid as a base resin; however, a phenyl pyruvic acid may be co-condensed with various aromatic compounds having a hydroxy group.

Specific example of the co-polymerizable phenol includes phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphthyl phenol, 3-naphthyl phenol, 4-naphthyl phenol, 4-trityl phenol, resorcinol, 2-methyl resorcinol, 4-methyl resorcinol, 5-methyl resorcinol, catechol, 4-t-butyl catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol, 1-naphthol, 2-naphthol, 2-methyl-1-naphthol, 4-methoxy-1-naphthol, 7-methoxy-2-naphthol, dihydroxy naphthalenes such as 1,5-dihydroxy naphthalene, 1,7-dihydroxy naphthalene, and 2,6-dihydroxy naphthalene, methyl 3-hydroxynaphthalene-2-carboxylate, hydroxy indene, hydroxy anthracene, hydroxy acenaphthylene, hydroxy acenaphthene, and trityl phenol.

In addition, the novolak resin may further contain a repeating unit "b1" shown by the following general formula (2),

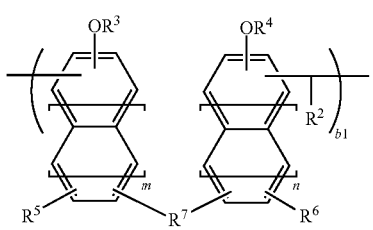

(2)

wherein R² represents the same meaning as before. R³ and R⁴ represent a hydrogen atom, or any of a linear, a branched, or a cyclic alkyl group or acyl group having 1 to 6 carbon atoms; and R⁵ and R⁶ represent a hydrogen atom, or any of a linear, a branched, or a cyclic alkyl group having 1 to 6 carbon atoms, wherein these groups may be optionally substituted by a halogen atom partially or all of them. R⁷ represents a single bond, or any of a linear, a branched, or a cyclic alkylene group having 1 to 20 carbon atoms, or a linear, a branched, or a cyclic alkenylene group having 2 to 20 carbon atoms, or an arylene group having 6 to 20 carbon atoms, wherein these groups may optionally contain a nitrogen atom, a hydroxy group, a carboxyl group, an alkoxy carbonyl group, an acyloxy group, an ether group, an ester group, a thioether group, or a lactone ring. R⁵ and R⁶ may be optionally bonded to form an ether ring. Here, "m" and "n" each represents 0 or 1; and "b1" is within the range of 0<b1<1.

Illustrative example of the phenol compound used for co-condensation thereby obtaining the repeating unit "b1" shown by the general formula (2) includes the following compounds.

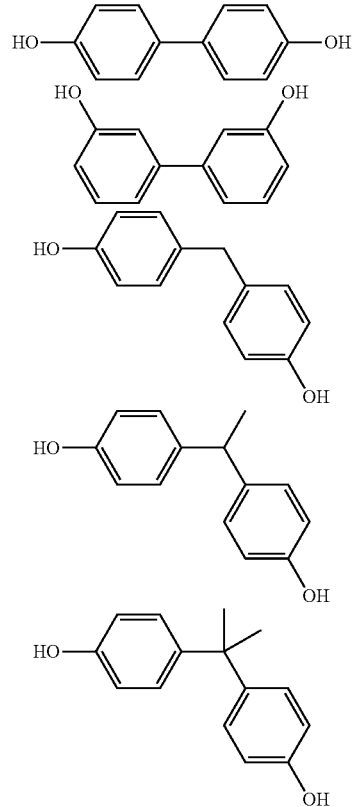

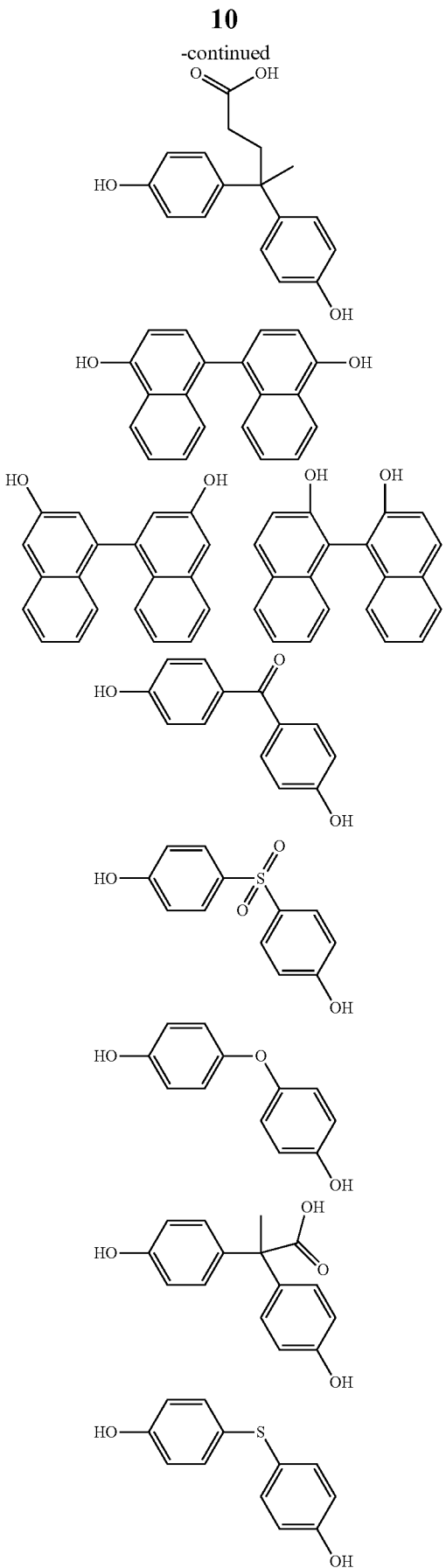

-continued
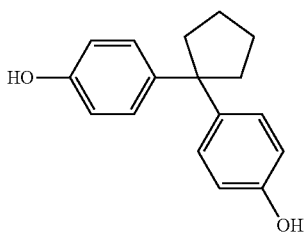
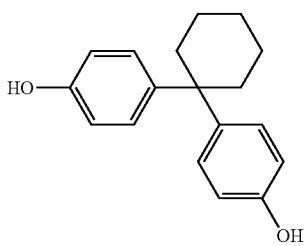
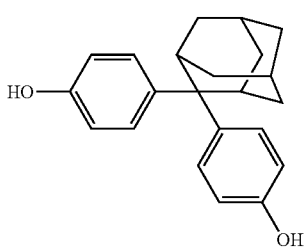
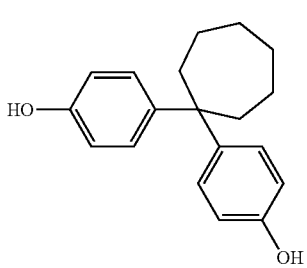
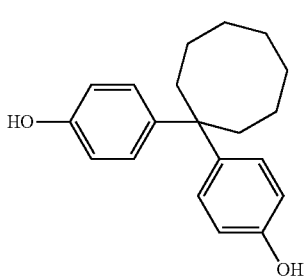
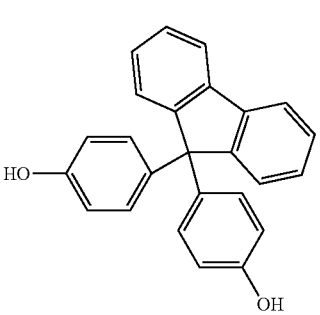
-continued
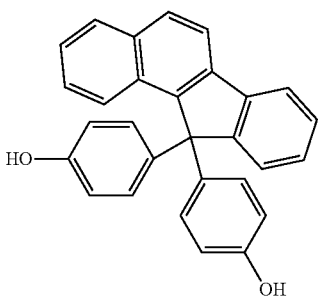
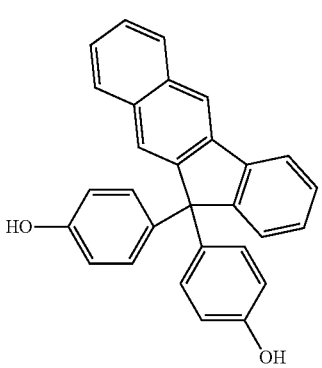
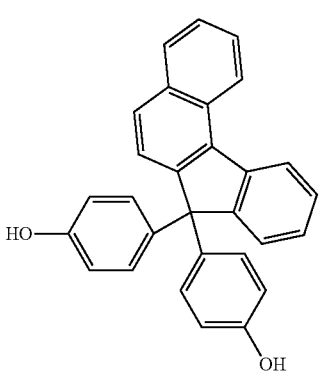
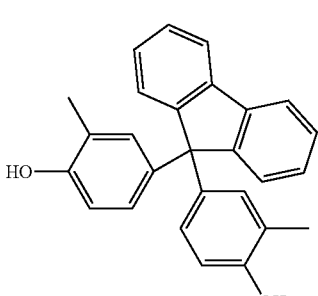
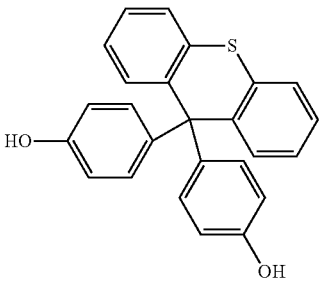

-continued
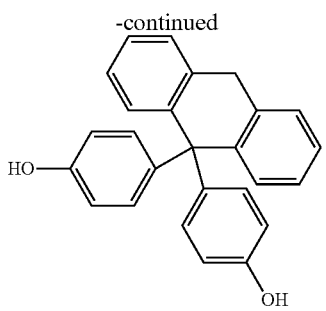
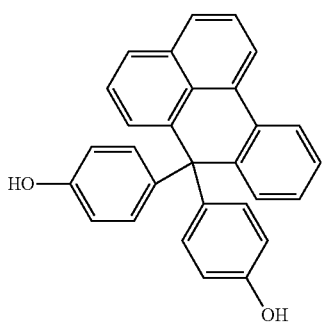
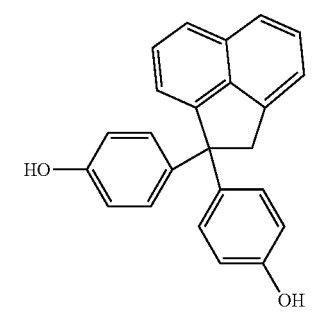
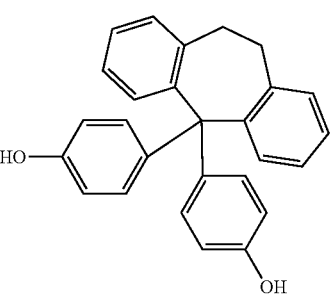
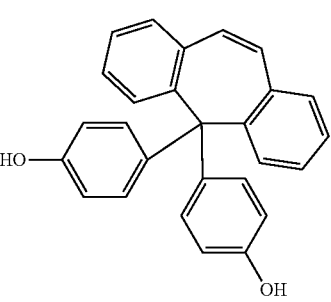
-continued
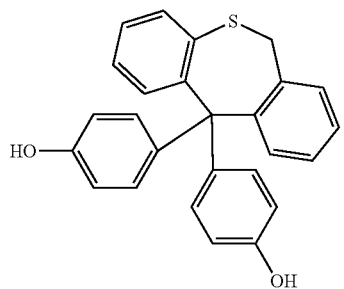
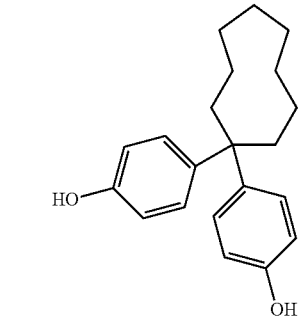
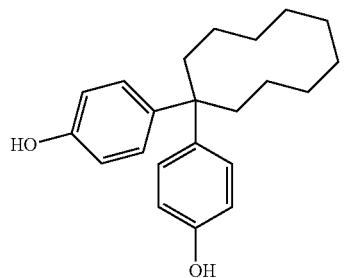
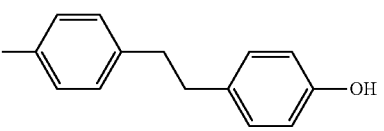
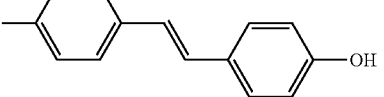
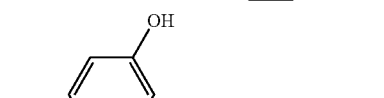
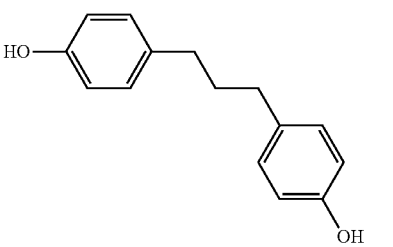

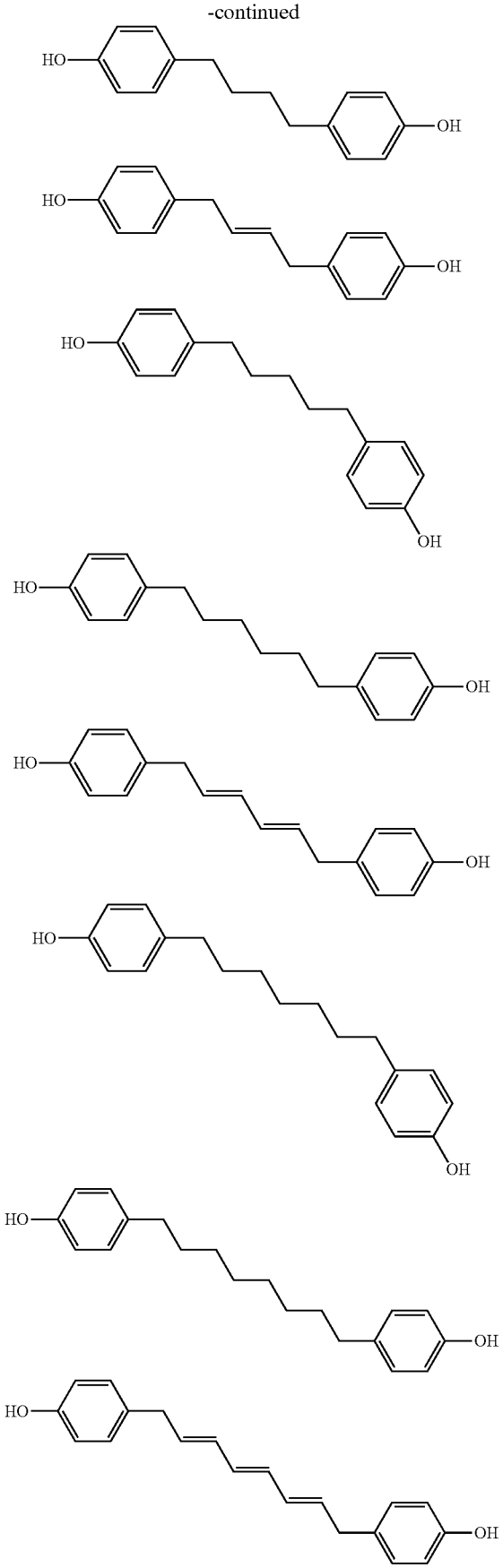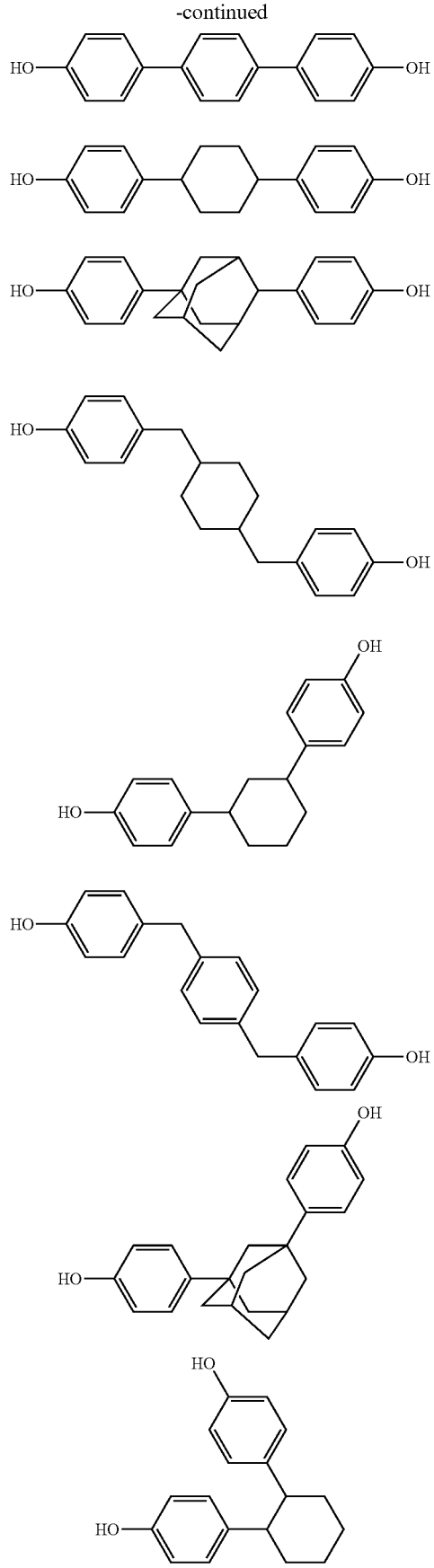

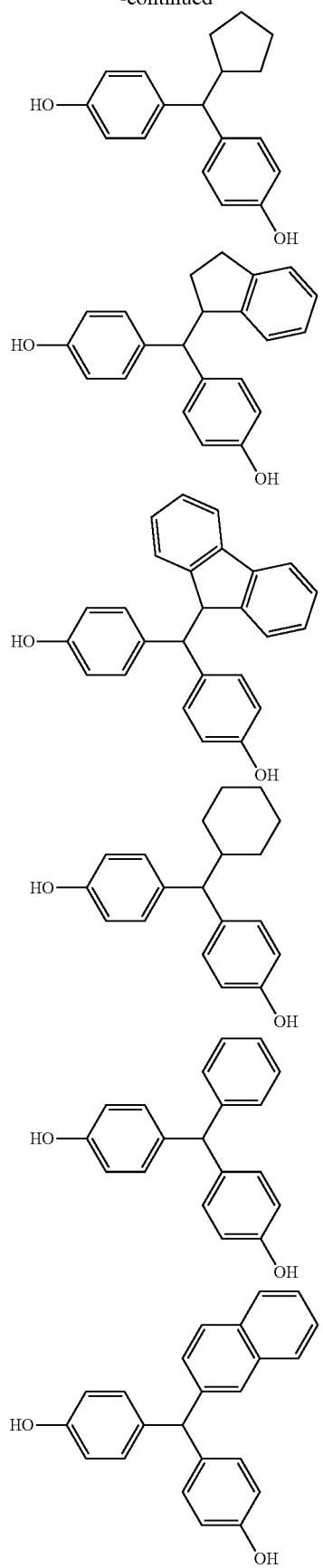
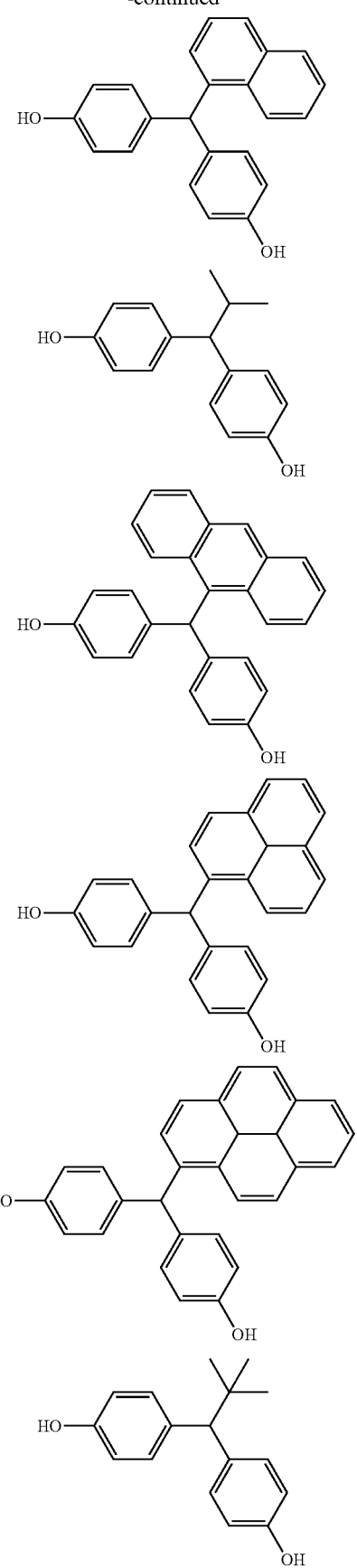

-continued
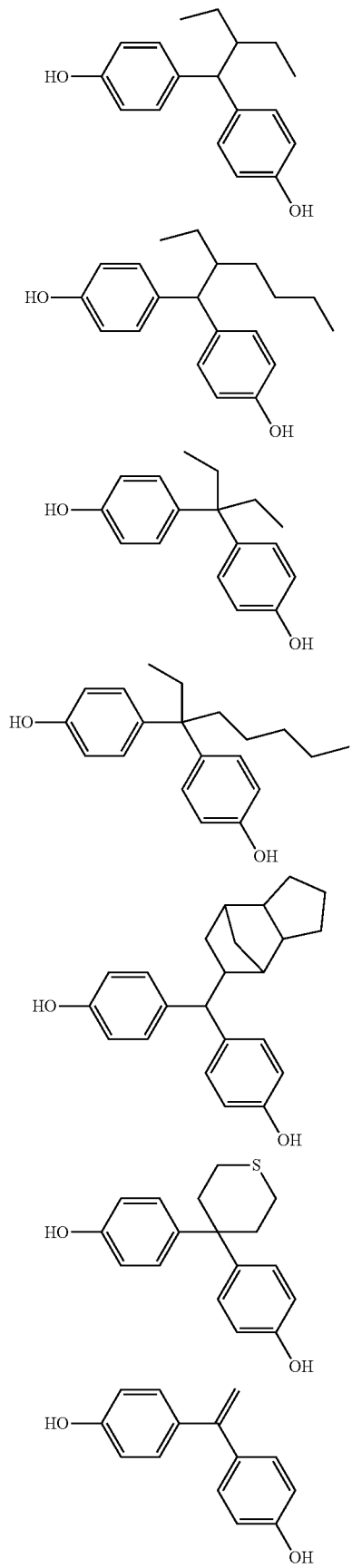
-continued
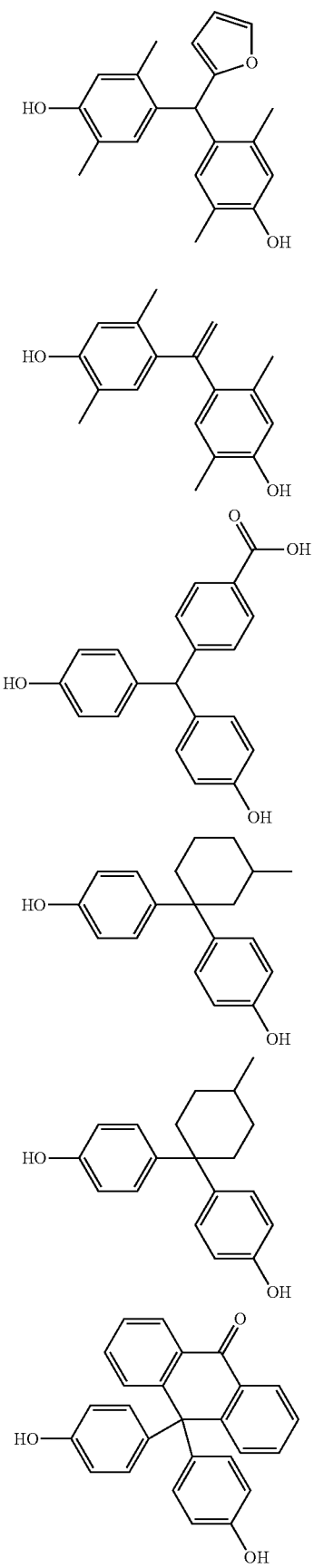

21
-continued
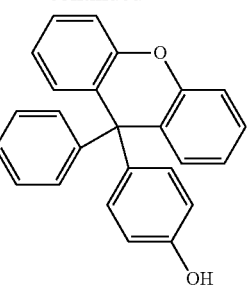
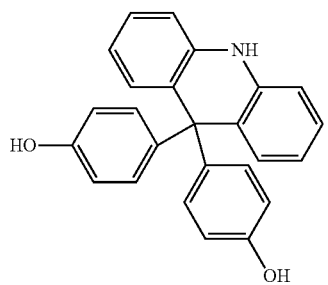
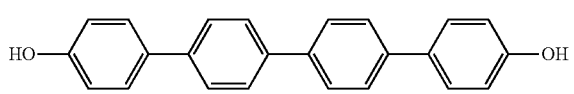
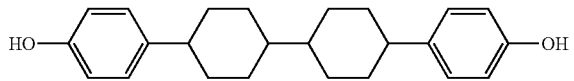
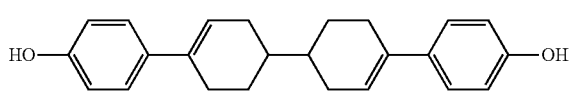
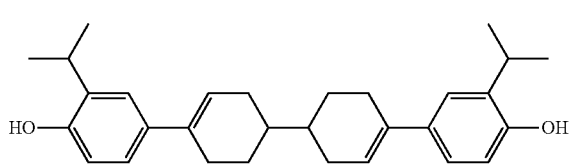
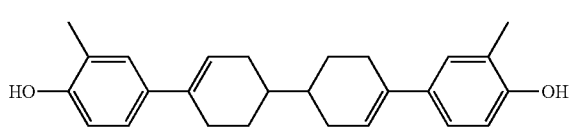
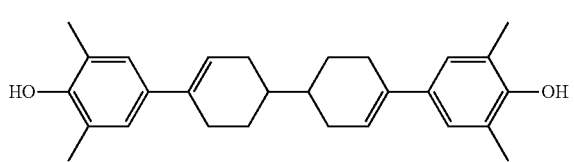
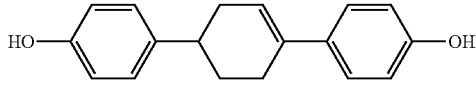
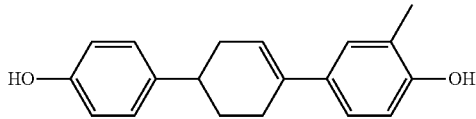
22
-continued
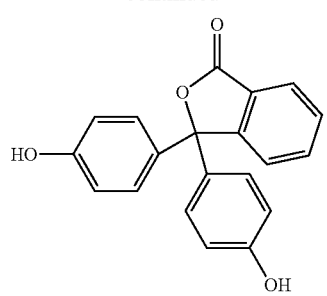
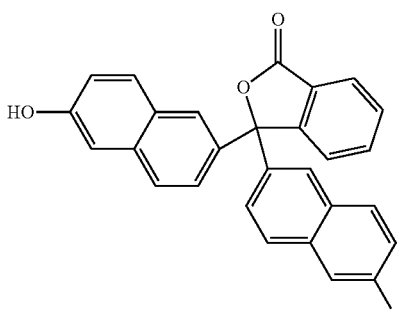
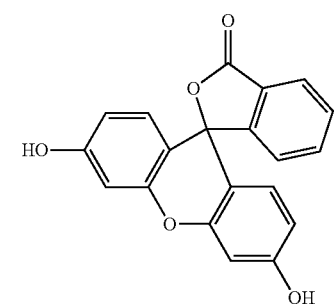
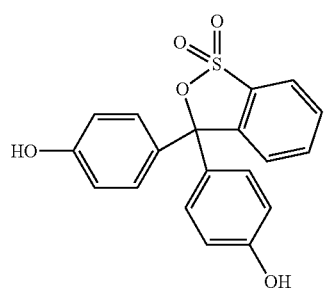
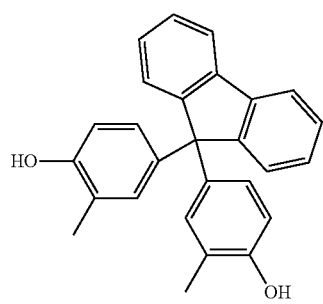 [SMILES: Cc1cc(C2(c3cc(C)c(O)c(C)c3)c3ccccc3-c3ccccc32)cc(C)c1O]

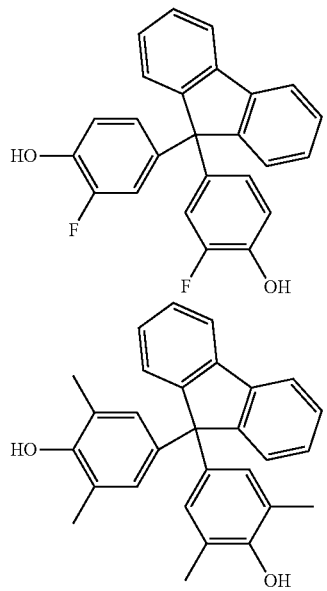

In addition, the novolak resin may further contain repeating unit "b2" shown by the following general formula (3),

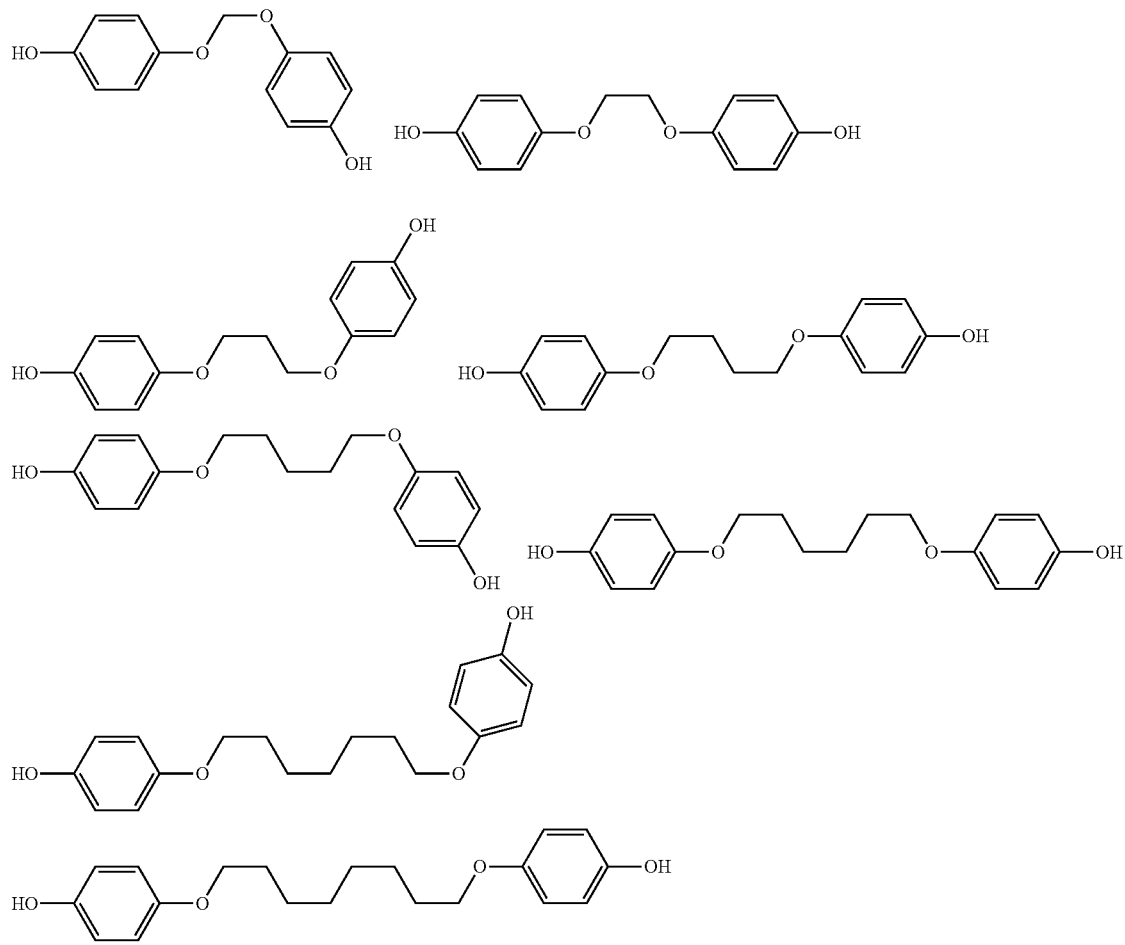

wherein $R^2$ represents the same meaning as before. $R^8$ and $R^9$ represent a hydrogen atom, or any of a linear, a branched, or a cyclic alkyl group or acyl group having to 6 carbon atoms; $R^{10}$ and $R^{11}$ represent a hydrogen atom, or any of a linear, a branched, or a cyclic alkyl group having 1 to 6 carbon atoms; and $R^{12}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group. Here, "m" and "n" each represents 0 or 1; and "b2" is within the range of 0<b2<1.

Illustrative example of the phenol compound used for co-condensation thereby obtaining the repeating unit "b2" shown by the general formula (3) includes the following compounds.

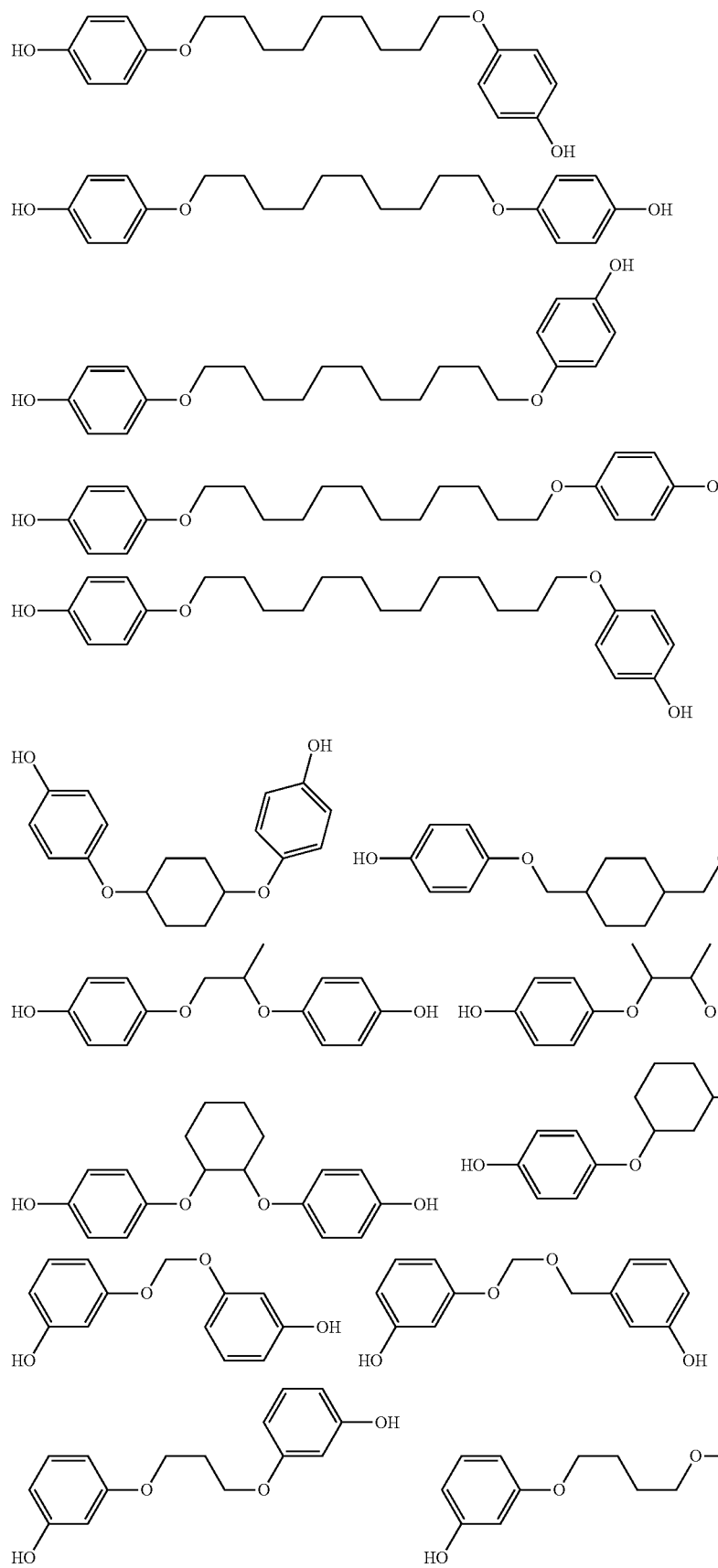

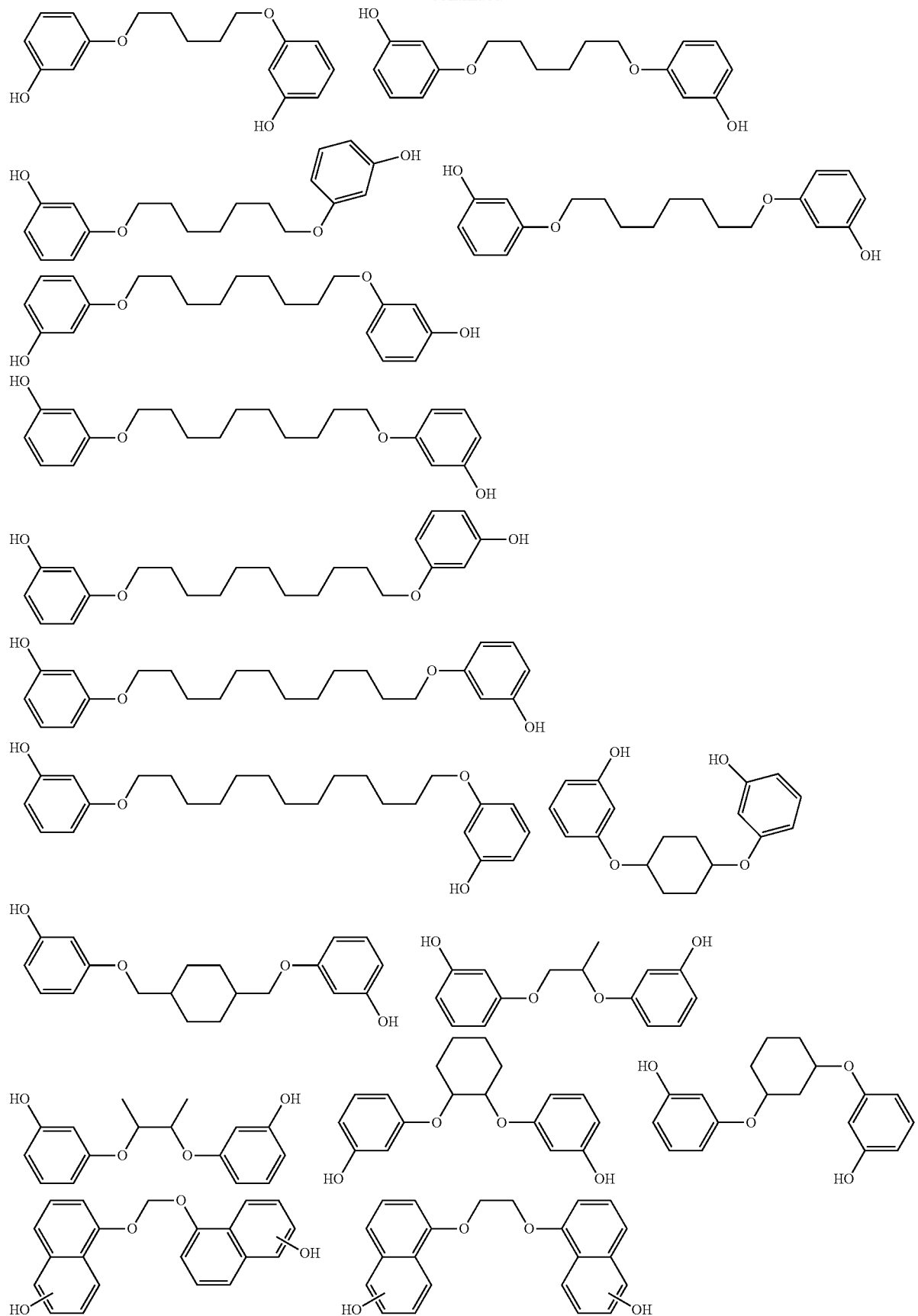

-continued
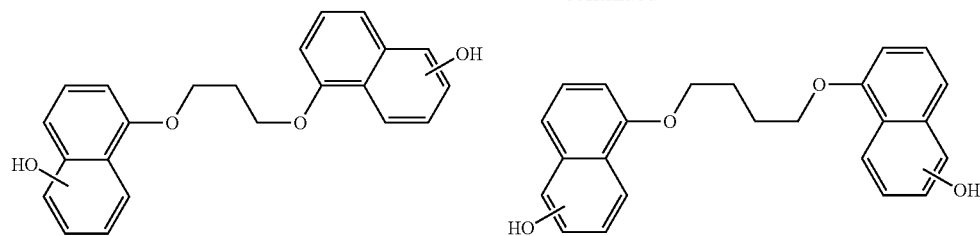
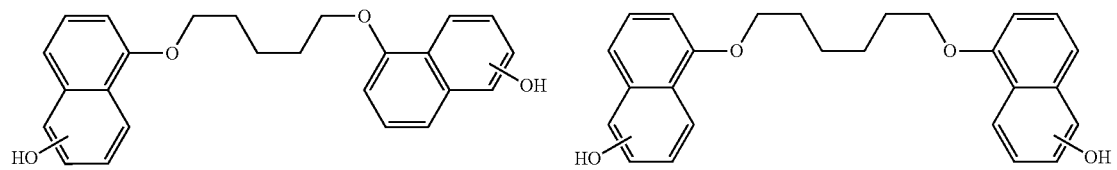
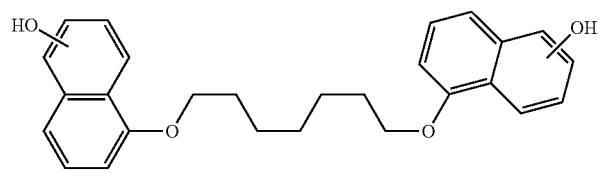
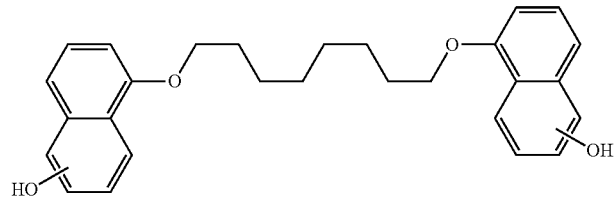
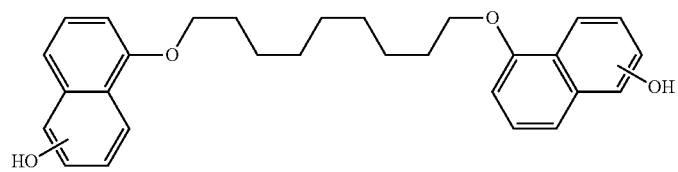
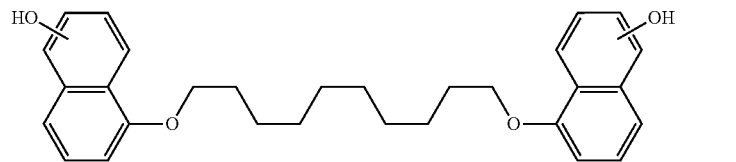
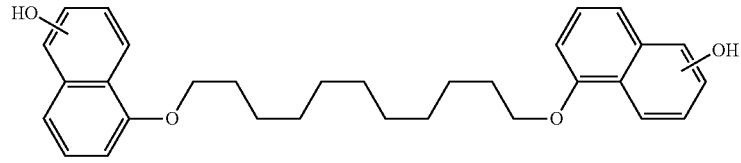
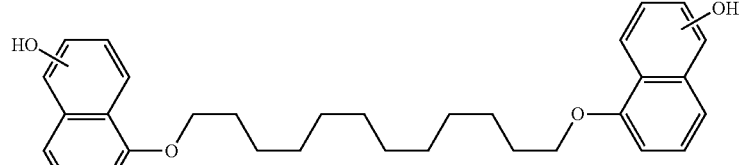
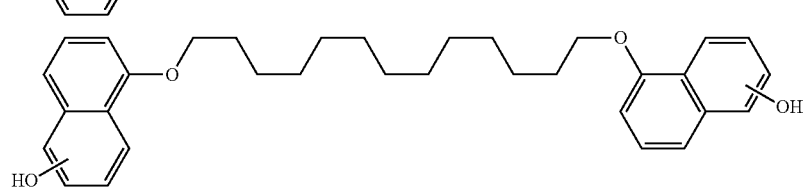

31 32
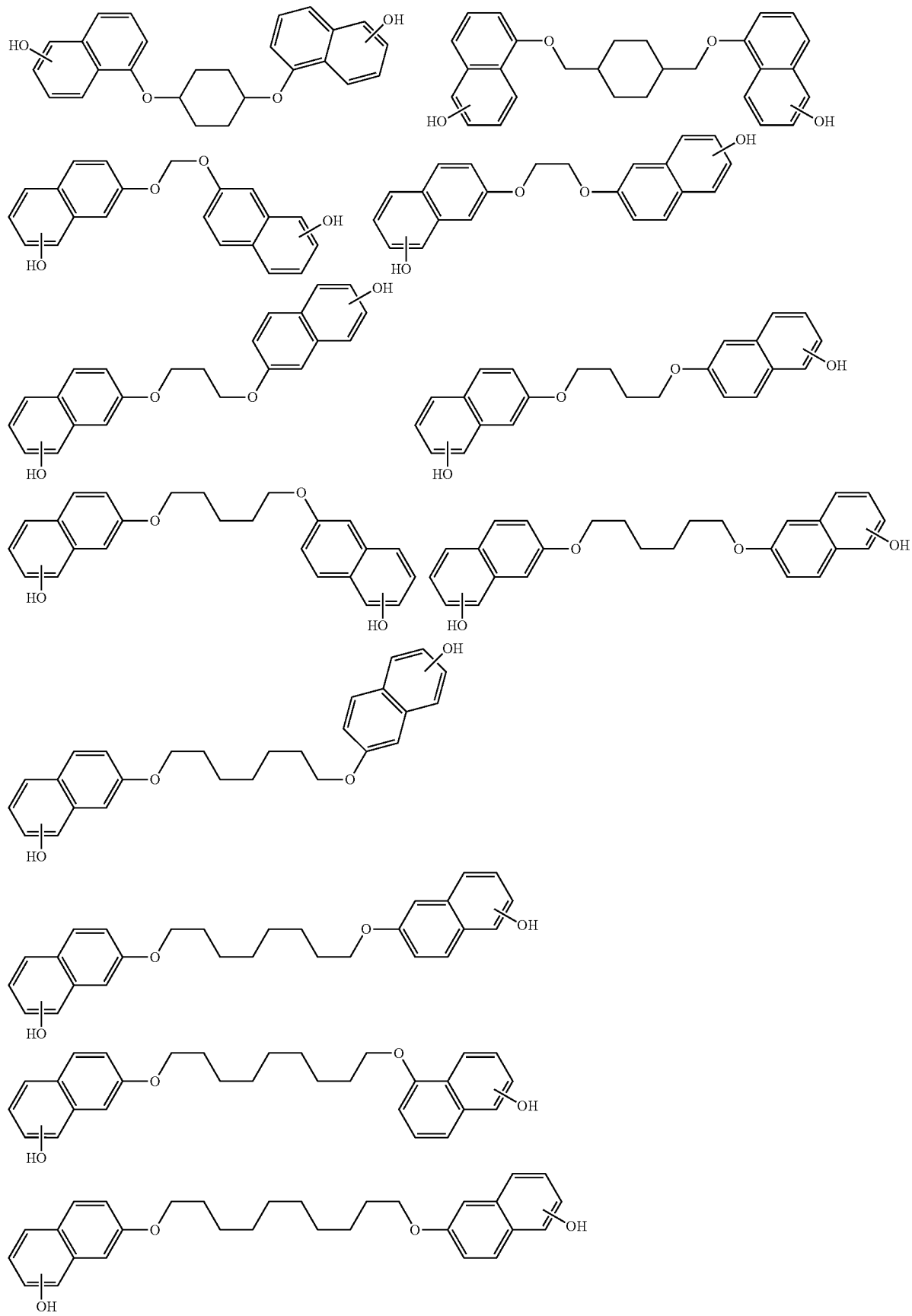

-continued
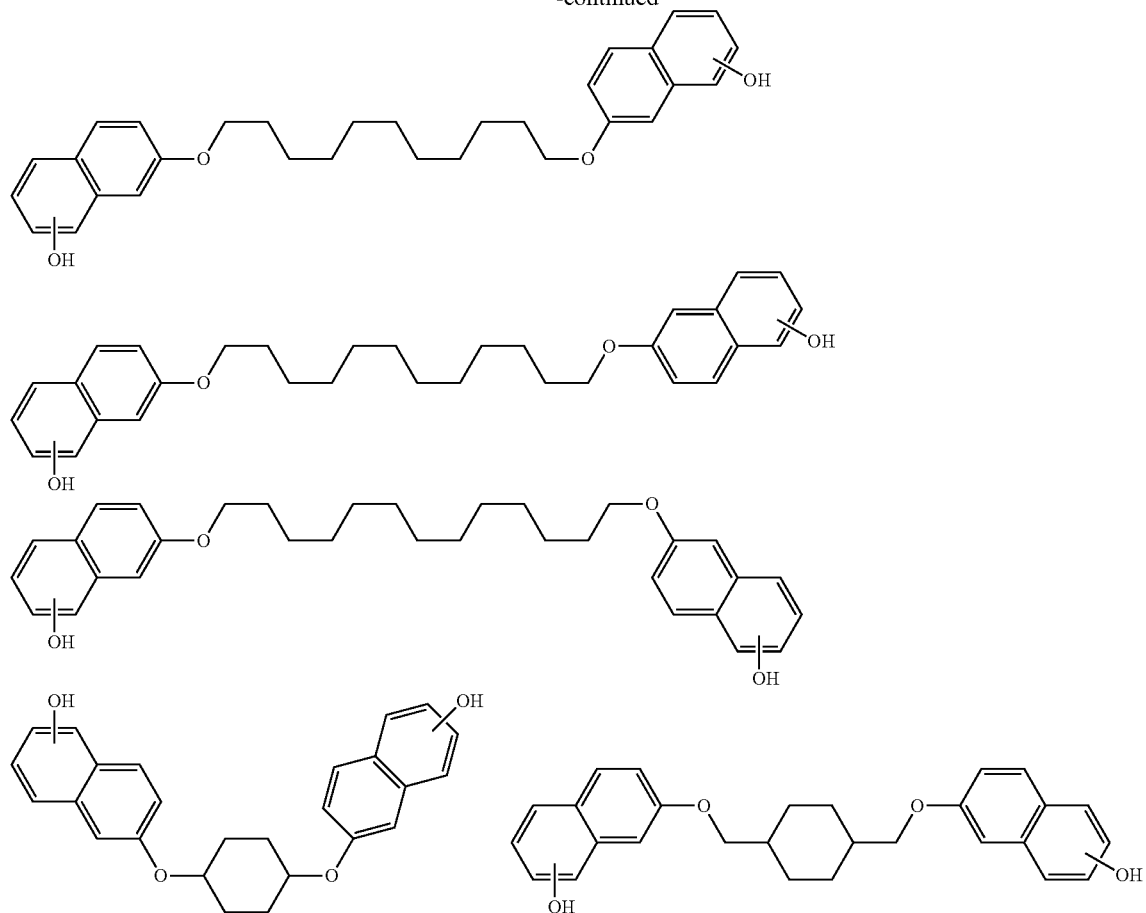
An aromatic compound having a benzyl alcohol may make a novolak resin even without an aldehyde. Illustrative example of the benzyl alcohol compound used for co-condensation thereby obtaining the repeating unit "b2" shown by the general formula (3) includes the following compounds.
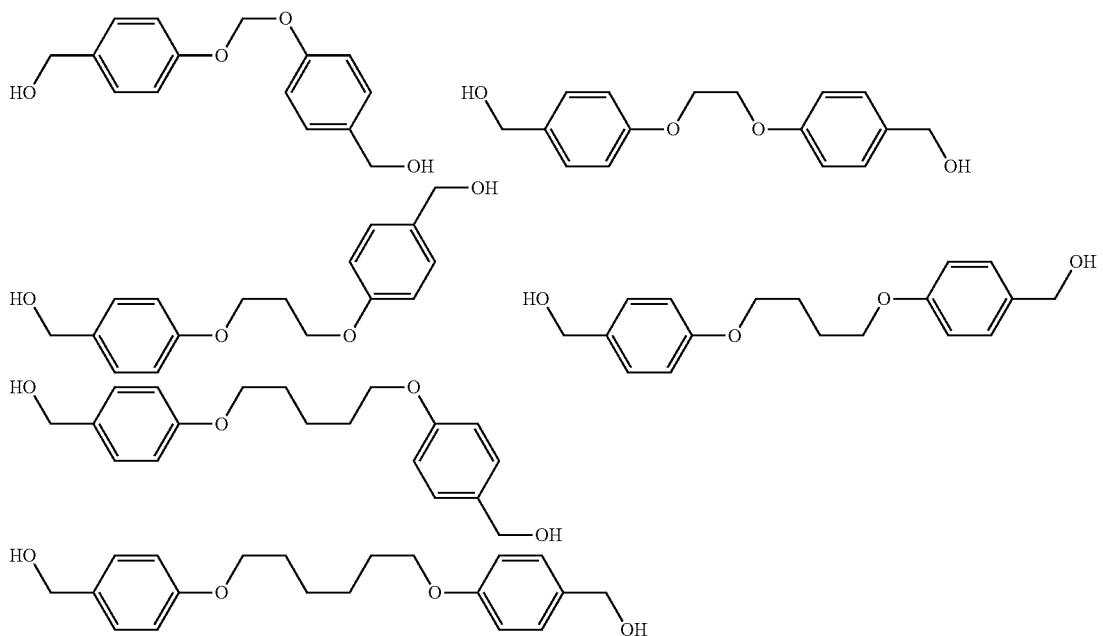

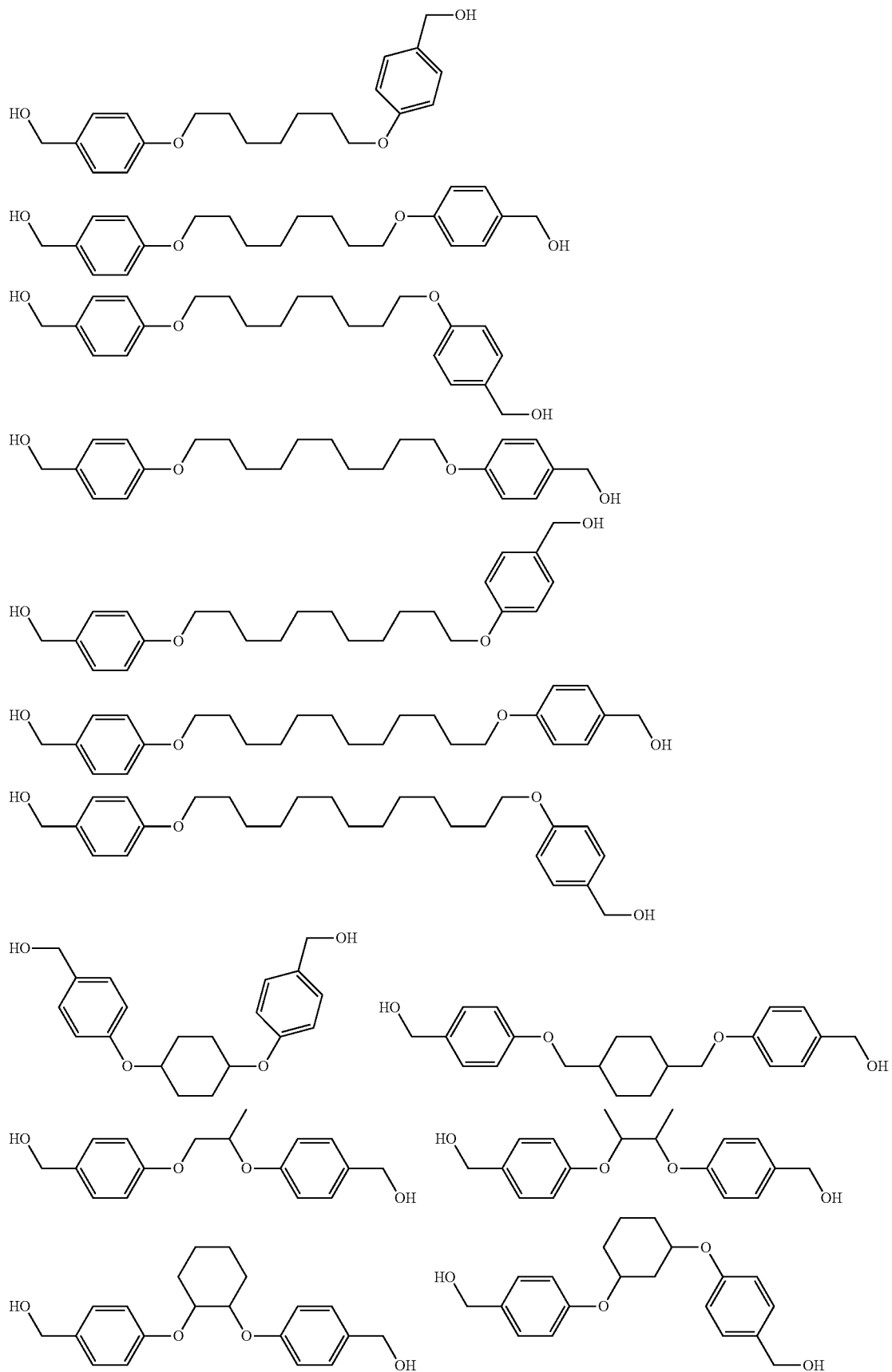

37
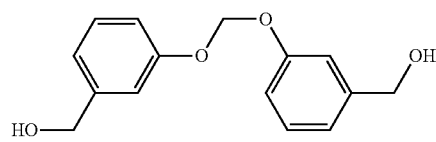
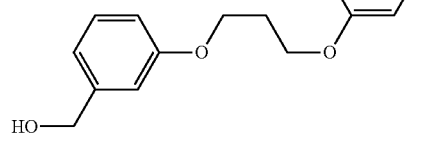
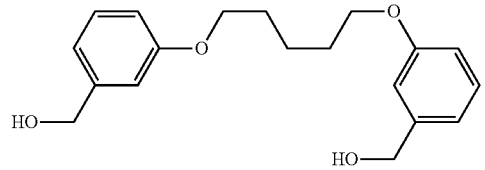
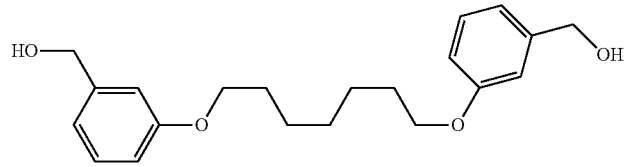
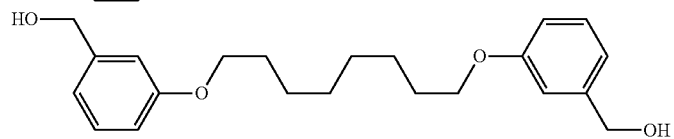
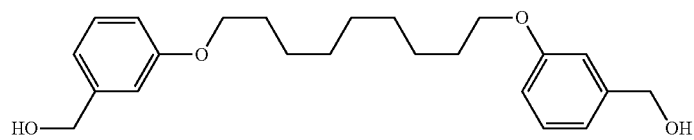
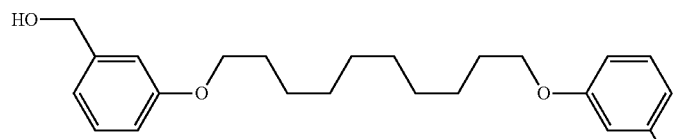
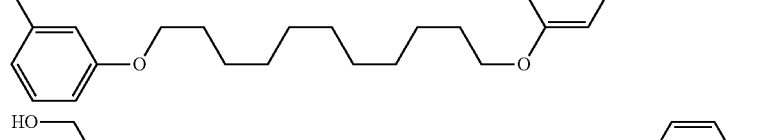
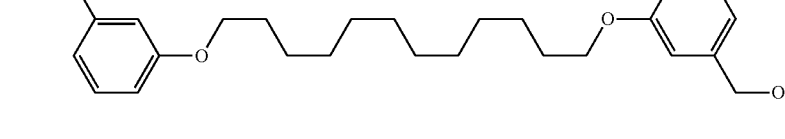
-continued
38
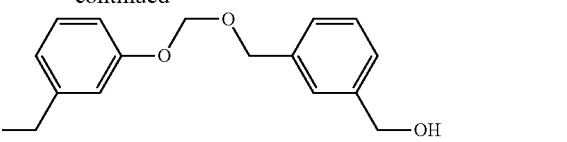
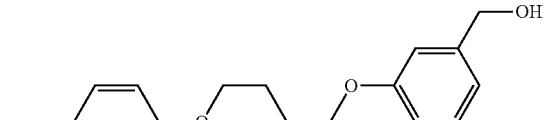
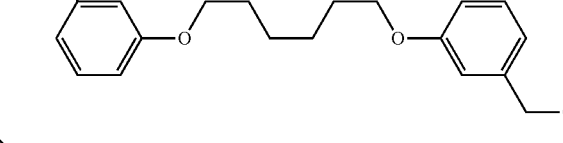
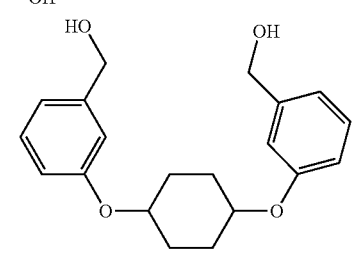

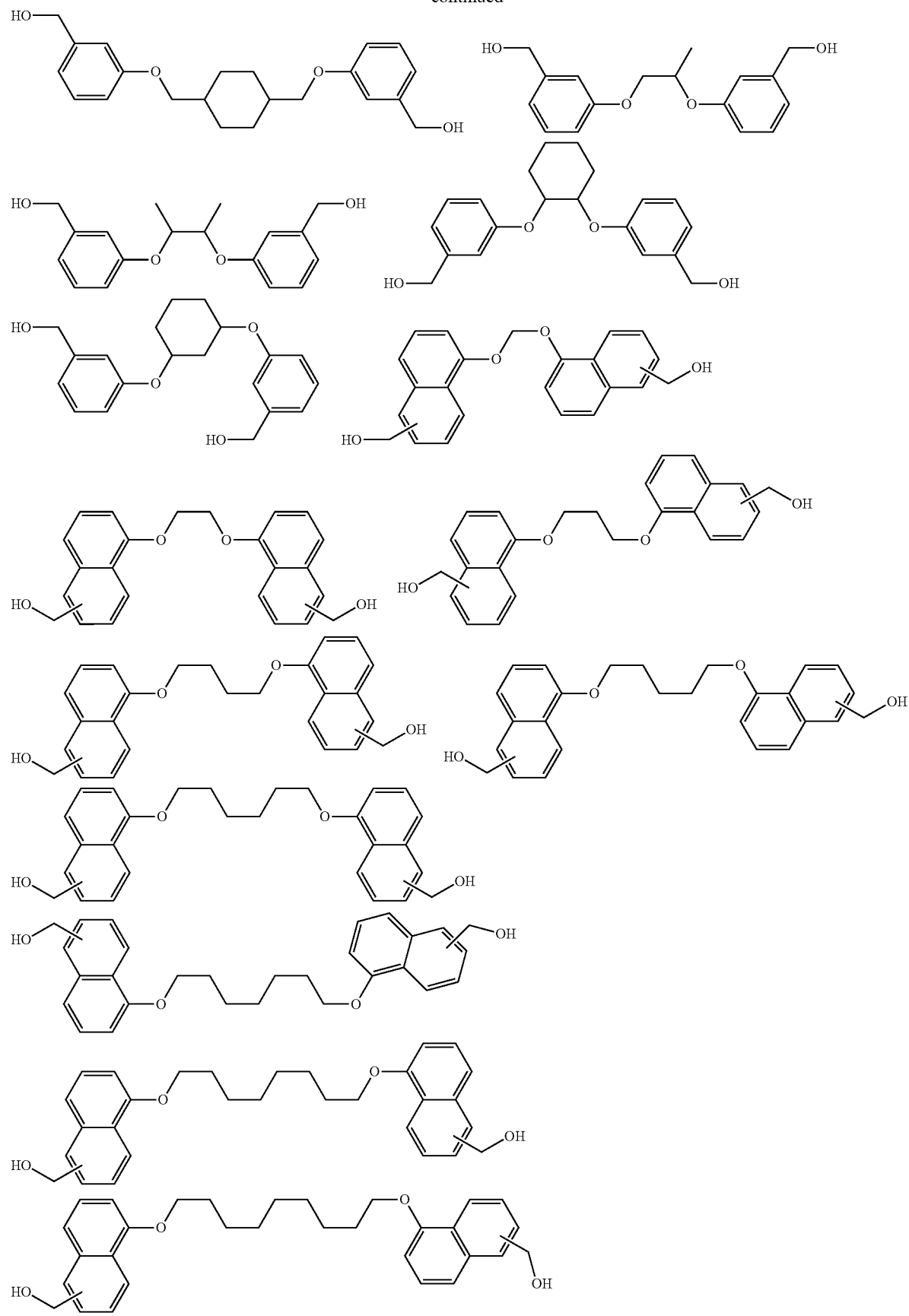

-continued
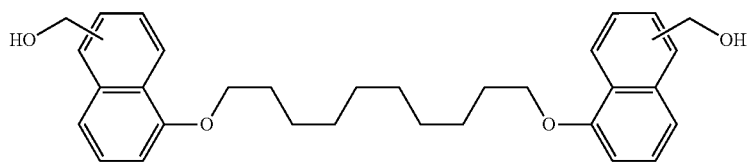
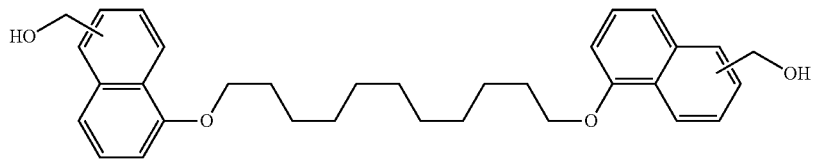
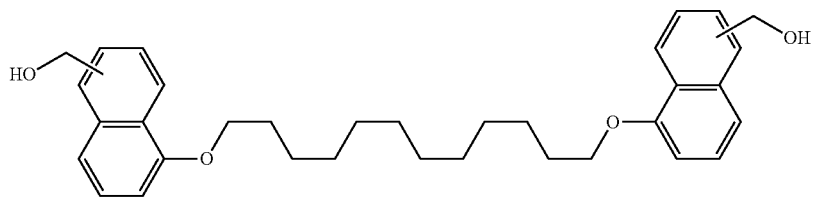
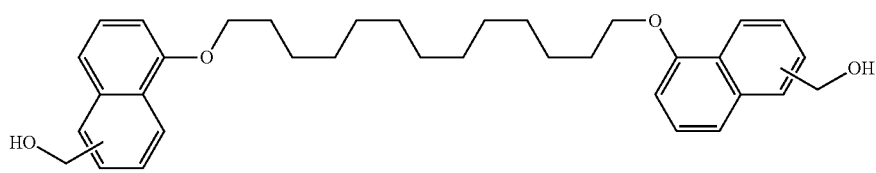
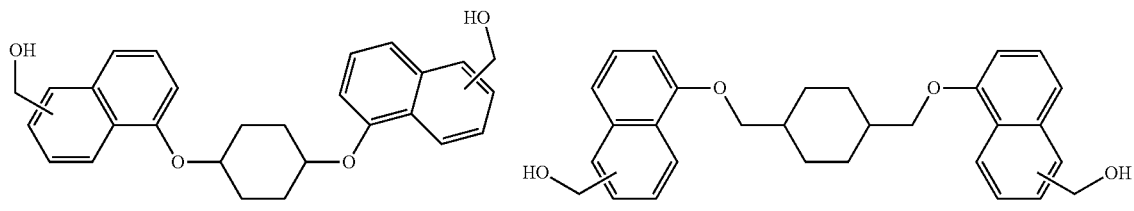
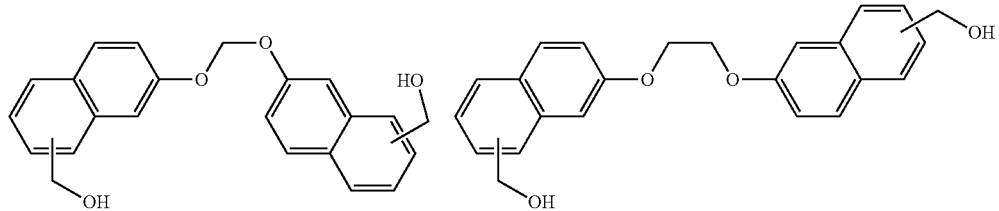
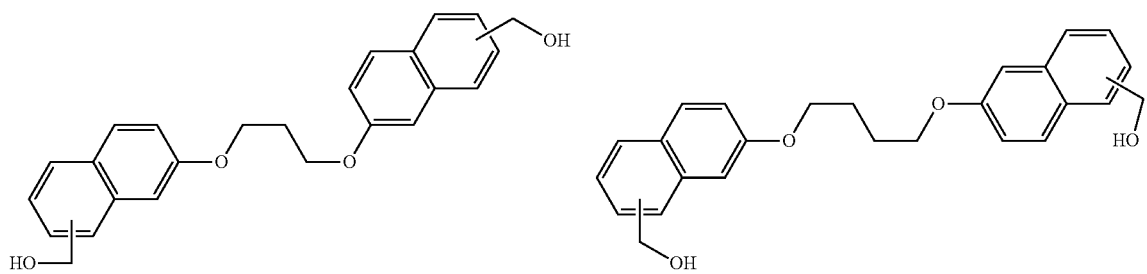
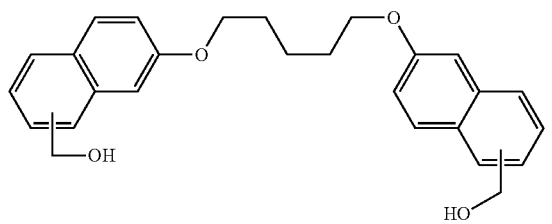

-continued
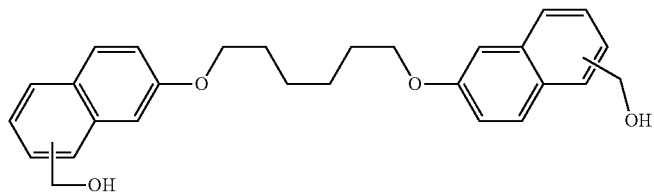
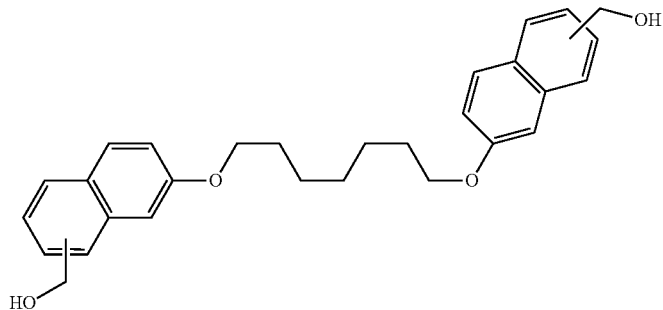
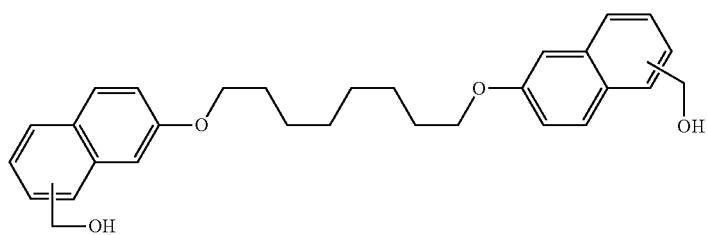
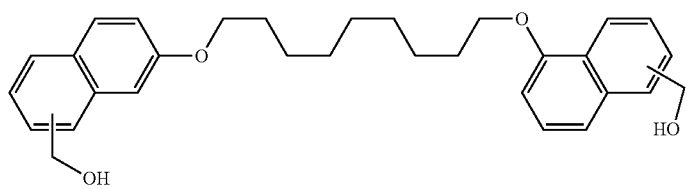
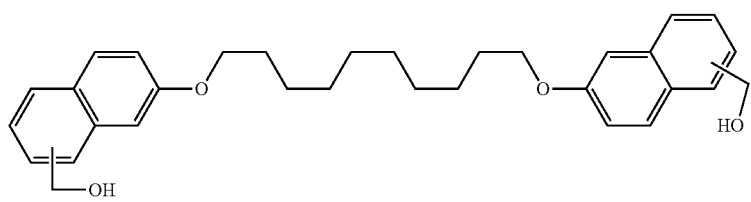
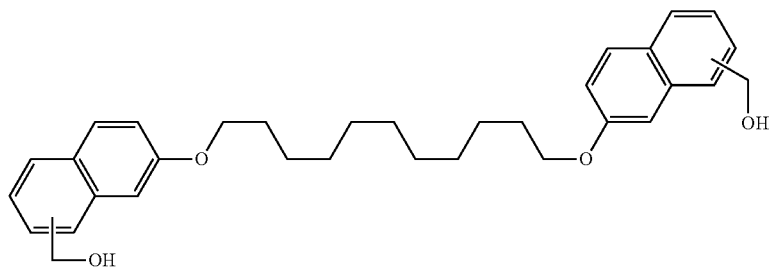
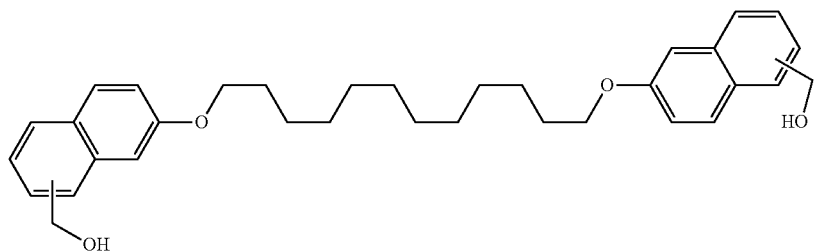

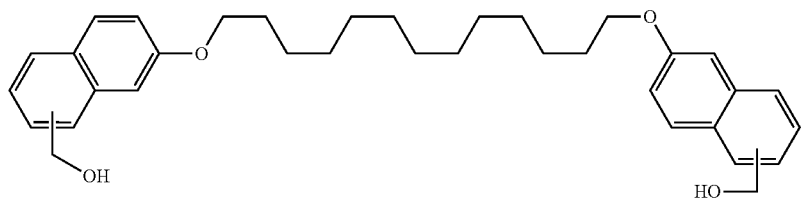

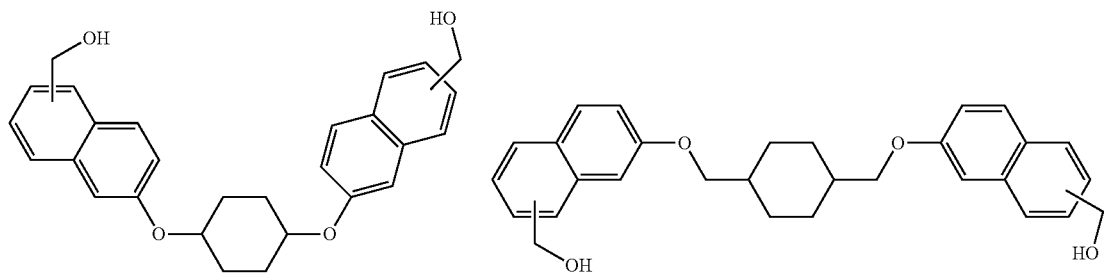

In addition, the novolak resin may further contain the repeating unit "b3" shown by the following general formula (4),

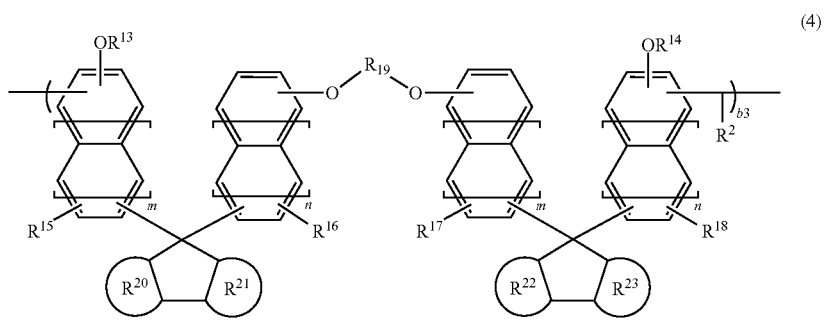

wherein $R^2$ represents the same meaning as before. $R^{13}$ and $R^{14}$ represent a hydrogen atom, or any of a linear, a branched, or a cyclic alkyl group or acyl group having 1 to 6 carbon atoms; $R^{15}$ to $R^{18}$ represent a hydrogen atom, or any of a linear, a branched, or a cyclic alkyl group having 1 to 6 carbon atoms; and $R^{19}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group. $R^{20}$ to $R^{23}$ represent a benzene ring or a naphthalene ring. Here, "m" and "n" each represents 0 or 1; and "b3" is within the range of 0<b3<1.

Illustrative example of the phenol compound used for co-condensation thereby obtaining the repeating unit "b3" shown by the general formula (4) includes the following fluorene bisphenol compounds.

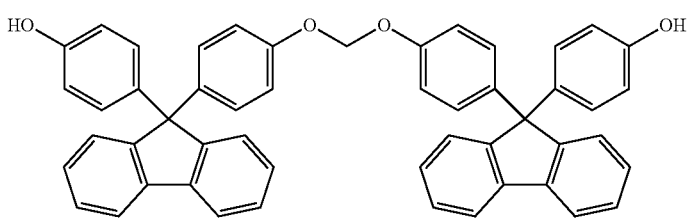

-continued
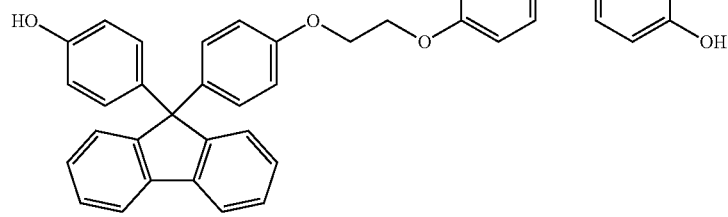
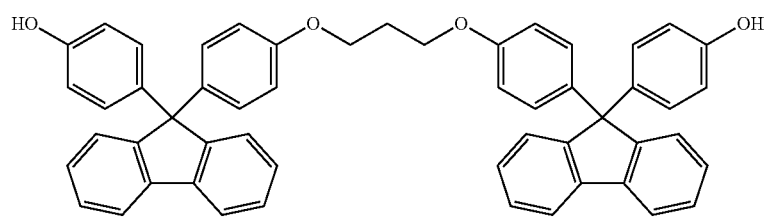
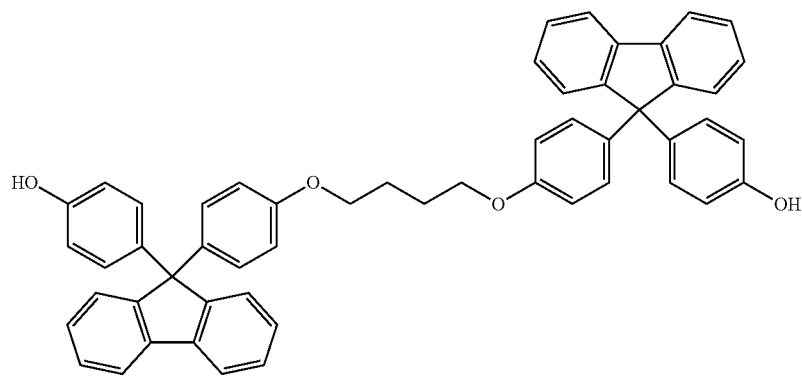
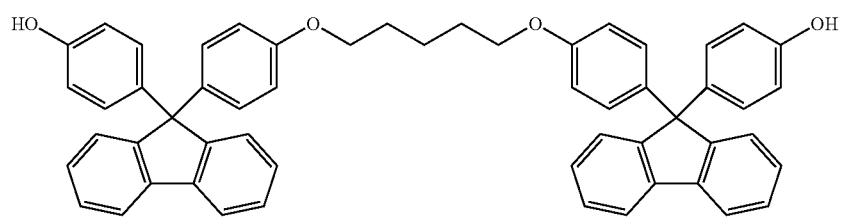
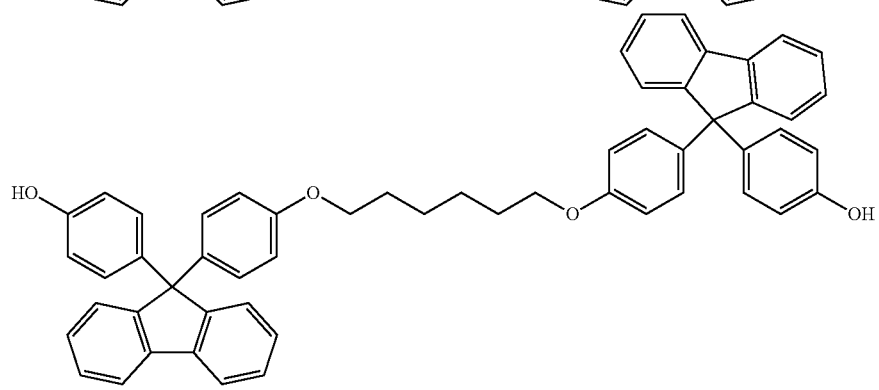

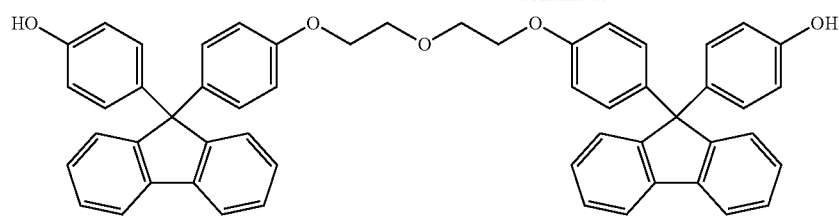
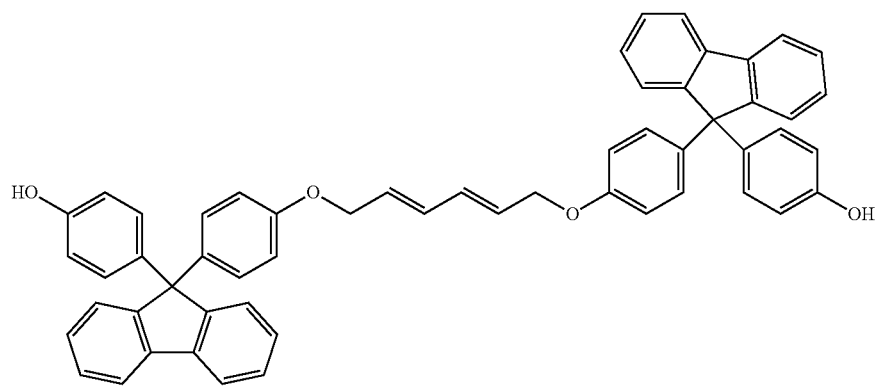
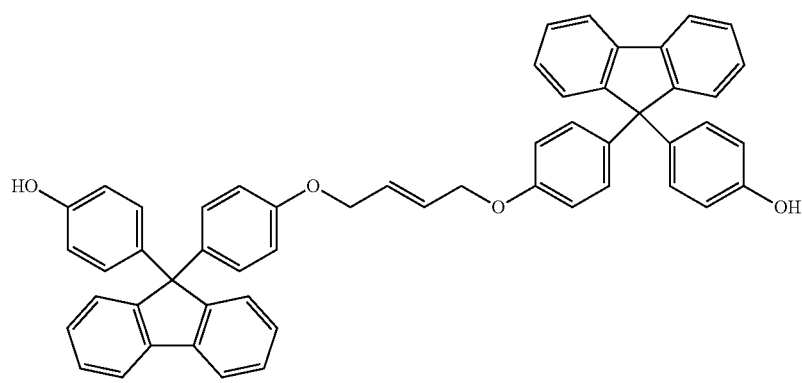
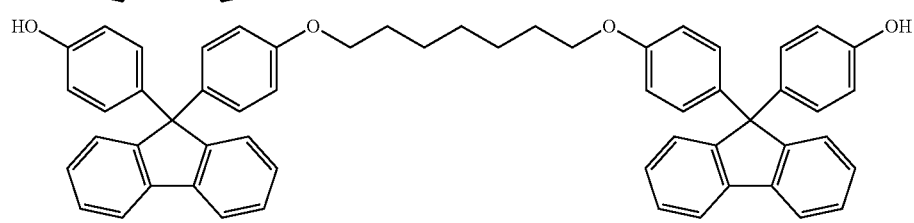
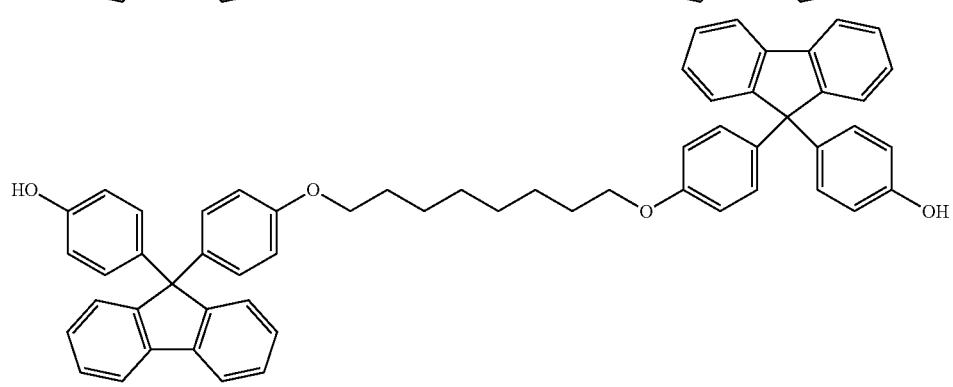

-continued
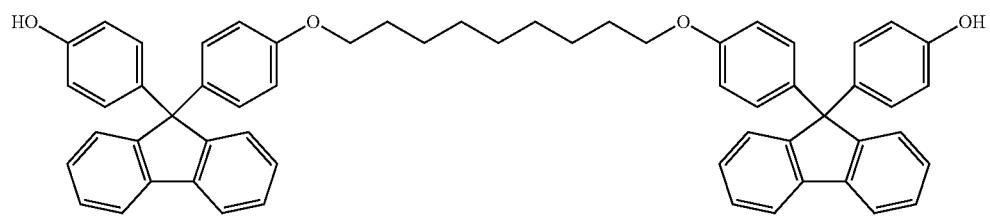
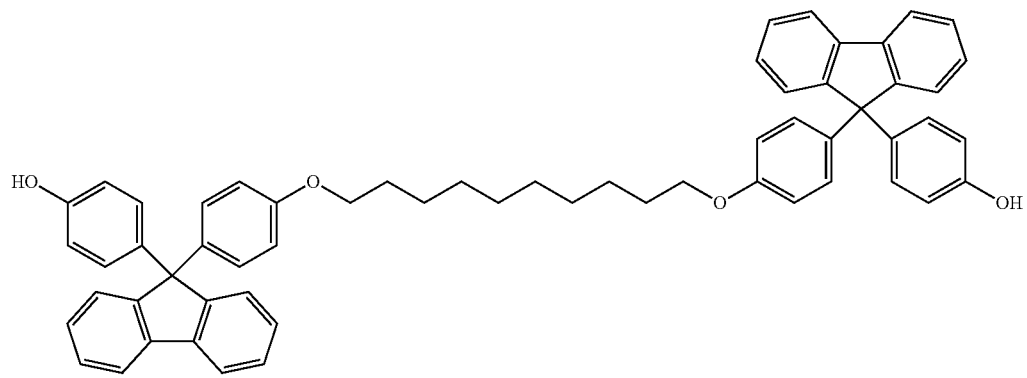
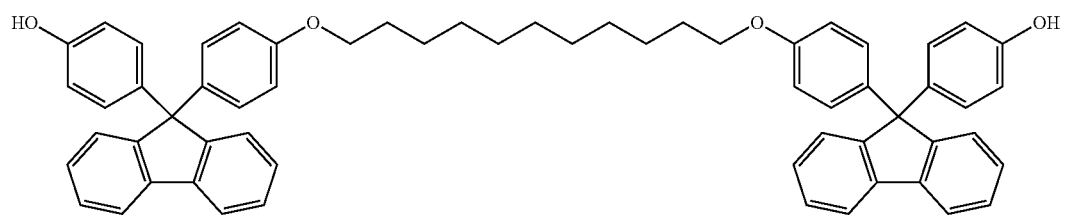
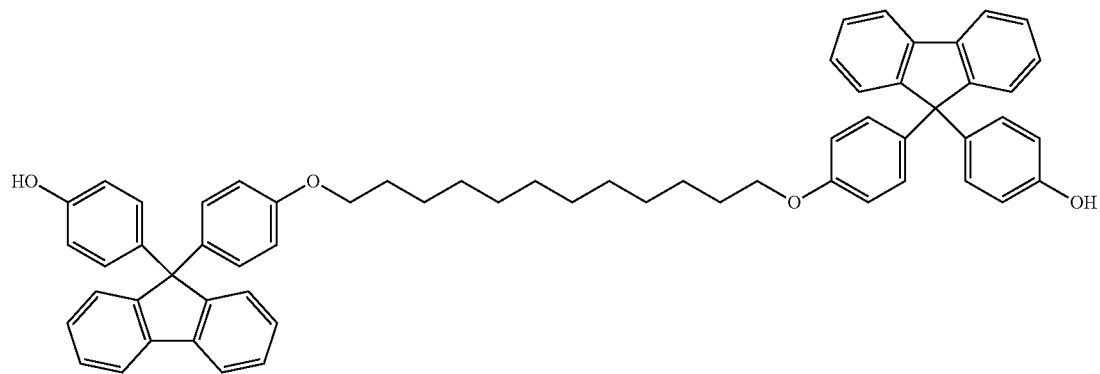
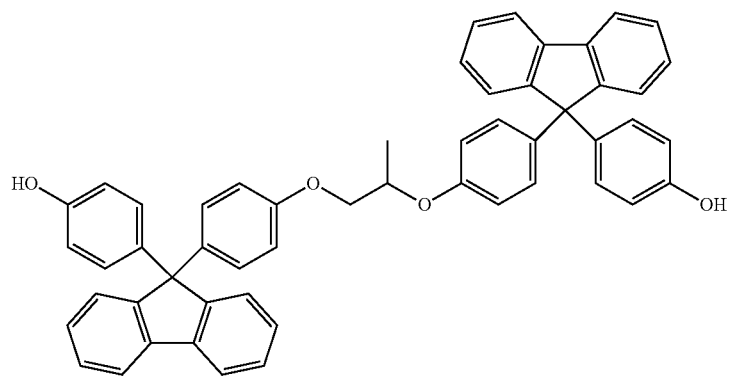

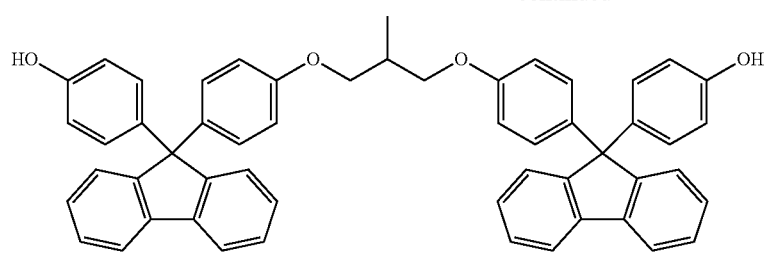
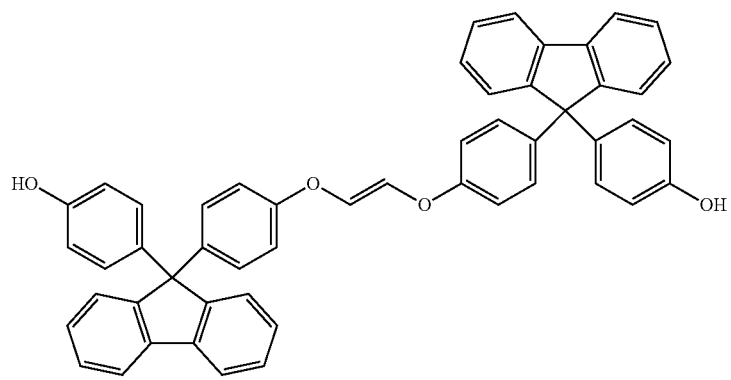
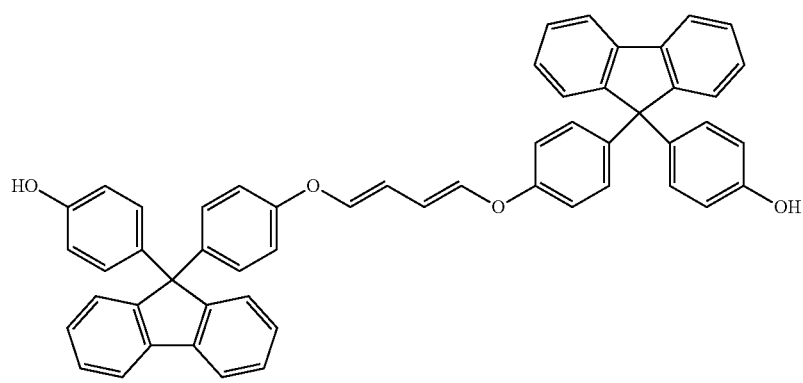
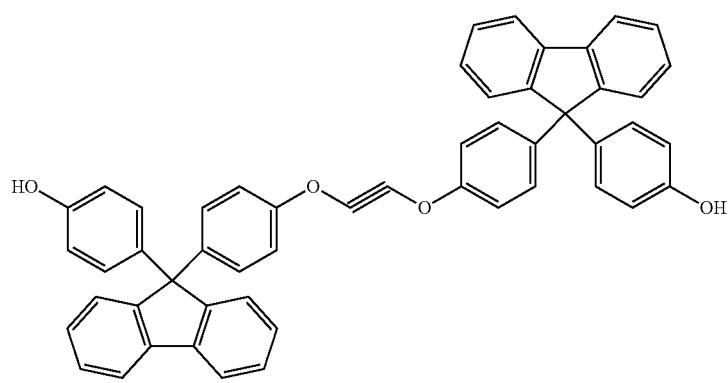
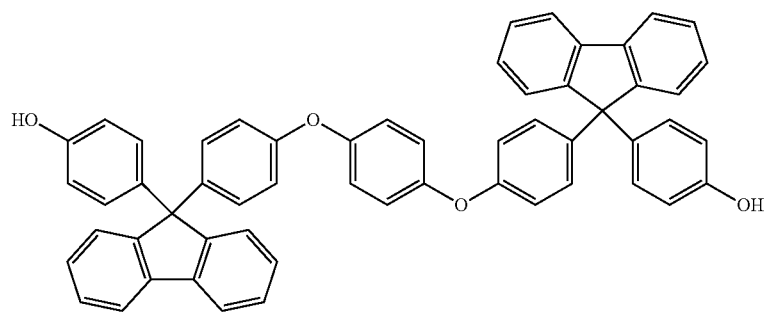

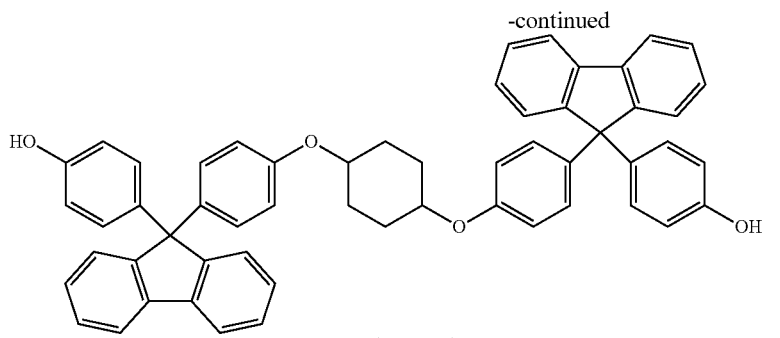

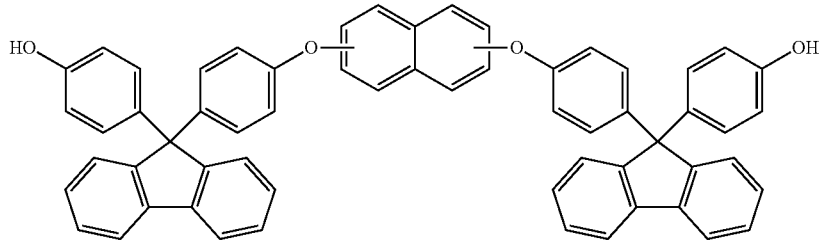

By using a compound bonded by a long chain alkylene as the aromatic material to form the repeating units "b1" to "b3", the stress relaxation effect thereby suppressing warping of the wafer due to the film's stress after patterning can be obtained. Especially in the case that the resist of the present invention is used as the thick insulation film, the stress relaxation mechanism becomes necessary. In the case that the resist film of the present invention is to be left as a permanent film after patterning, the heat resistance becomes also necessary. In order to enhance the heat resistance, a rigid structure with a high carbon content, typically represented by fluorene, is necessary. The most desirable compounds having both the flexible structure and the rigid structure with a high carbon content are those having a fluorene bisphenol bonded by means of an alkylene bond.

The novolak resin of the phenyl pyruvic acid of the present invention may be made to be a novolak by a condensation reaction in which an aldehyde is added. When an aromatic compound having a benzyl alcohol is used, this aldehyde is not necessary. By making a novolak, its molecular weight may be increased so that not only the property to slow the dissolution rate into the developer in the crosslinking reaction can be obtained but also the thermal deformation during the time of baking after patterning can be suppressed.

Illustrative example of the aldehyde that can be used here includes formaldehyde, trioxane, paraformaldehyde, benzaldehyde, methoxy benzaldehyde, phenyl benzaldehyde, trityl benzaldehyde, cyclohexyl benzaldehyde, cyclopentyl benzaldehyde, t-butyl benzaldehyde, naphthalene aldehyde, hydroxy naphthalene aldehyde, anthracene aldehyde, fluorene aldehyde, pyrene aldehyde, methoxy naphthalene aldehyde, dimethoxy naphthalene aldehyde, acetaldehyde, propyl aldehyde, phenyl acetaldehyde, naphthalene acetaldehyde, substituted or unsubstituted carboxyl naphthalene acetaldehyde, α-phenyl propyl aldehyde, β-phenyl propyl aldehyde, o-hydroxy benzaldehyde, m-hydroxy benzaldehyde, p-hydroxy benzaldehyde, o-chloro benzaldehyde, m-chloro benzaldehyde, p-chloro benzaldehyde, o-nitro benzaldehyde, m-nitro benzaldehyde, p-nitro benzaldehyde, o-methyl benzaldehyde, m-methyl benzaldehyde, p-methyl benzaldehyde, p-ethyl benzaldehyde, p-n-butyl benzaldehyde, furfural, furan carboxy aldehyde, and thiophene aldehyde. Among them, formaldehyde may be used especially suitably. These aldehydes may be used solely or as a combination of two or more of them.

The amount of these aldehydes to be used is preferably in the range of 0.2 to 5 moles, or more preferably in the range of 0.5 to 2 moles, relative to 1 mole of the phenyl pyruvic acid and the phenol compound to be co-polymerized with this.

In the condensation reaction of the aldehyde with the phenyl pyruvic acid and the phenol compound to be co-condensed with this, a catalyst may also be used. Specific example thereof includes acid catalysts such as hydrochloric acid, nitric acid, sulfuric acid, formic acid, oxalic acid, acetic acid, methanesulfonic acid, camphor sulfonic acid, tosic acid, and trifluoromethane sulfonic acid.

The amount of the acid catalyst to be used is preferably in the range of $1 \times 10^{-5}$ to $5 \times 10^{-1}$ mole relative to 1 mole of the phenyl pyruvic acid and the phenol compound to be co-condensed with this.

Molecular weight of the novolak resin of the phenyl pyruvic acid and the phenol compound to be co-condensed with this having the repeating units shown by the formulae (1) to (4) may be made in the range of 400 to 50,000 as the weight-average molecular weight. The molecular weight thereof is preferably in the range of 500 to 20,000, or more preferably in the range of 600 to 10,000. If the molecular weight is 400 or more, there is no risk of the deterioration of the lithography characteristics due to the increase of the acid diffusion. On the other hand, if the molecular weight is 50,000 or less, the sufficient dissolution contrast may be obtained. As discussed above, it is preferable to optimize the molecular weight from the view point of the dissolution contrast as well as the acid diffusion. Besides, in order to optimize the lithography characteristics, it is preferable not only to cut out the unpolymerized monomer as much as possible but also to minimize the amounts of the low molecular weight dimer and trimer as low as possible. By so doing, not only the lithography, characteristics but also, for example, such as the implantation characteristics to implant the concavity and convexity of the substrate may be acquired.

The negative resist composition of the present invention may be made to be a chemically amplified resist composition by containing therein an acid generating compound which generates an acid by being sensitized by a high energy beam (acid generator). Any acid generator component may be used as far as it can generate an acid by irradiation with a high energy beam. Illustrative example of the preferable acid generator includes the types of a sulfonium salt, an iodonium salt, a sulfonyl diazomethane, an N-sulfonyl oxyimide, and an oxime-O-sulfonate. These may be used solely or as a mixture of two or more of them.

Specific examples of the acid generator are described in the paragraphs [0122] to [0142] of the Japanese Patent Laid-Open Publication No. 2008-111103.

Onium salts including a sulfonium salt, an iodonium salt, and an ammonium salt of a sulfonic acid whose α-position is not fluorinated and a carboxylic acid, as described in the Japanese Patent Laid-Open Publication No. 2008-158339, may also be used as a quencher. An α-position fluorinated sulfonic acid, an imidic acid, and a methide acid are necessary for deprotection of an acid-labile group of a carboxylate ester, and these undergo a salt exchange with the onium salts whose α-positions are not fluorinated whereby releasing the sulfonic acid whose α-position is not fluorinated and the carboxylic acid. Because the sulfonic acid whose α-position is not fluorinated and the carboxylic acid do not undergo the deprotection reaction, they can function as quenchers. Especially because the sulfonium salt and the iodonium salt of the sulfonic acid whose α-position is not fluorinated and the carboxylic acid undergo degradation by a light, the quenching abilities thereof in the area where the light intensity is high are decreased, and concentrations of the α-position fluorinated sulfonic acid, the imidic acid, and the methide acid are increased. As a consequence of it, the contrast in the exposed area is enhanced. Besides, the onium salts including the sulfonium salt, the iodonium salt, and the ammonium salt of the sulfonic acid whose α-position is not fluorinated and the carboxylic acid are highly effective to suppress the diffusion of the α-position fluorinated sulfonic acid, the imidic acid, and the methide acid. This is because the molecular weights of the onium salts after the salt exchange become larger whereby suppressing the mobility thereof. Therefore, addition of the onium salts including the sulfonium salt, the iodonium salt, and the ammonium salt of the sulfonic acid whose α-position is not fluorinated and the carboxylic acid and of a carbamate compound that can release an amine compound by an acid is important from the view point of suppressing the acid diffusion.

The resist composition of the present invention can further contain any one or more selected from an organic solvent, a basic compound, a surfactant, a dissolution controlling agent, and an acetylene alcohol.

Specific examples of the organic solvent are described in the paragraphs of [0144] to [0145] of the Japanese Patent Laid-Open Publication No. 2008-111103, those of the basic compound in the paragraphs of [0146] to [0164] of the same, those of the surfactant in the paragraphs of [0165] to [0166] of the same, those of the dissolution controlling agent in the paragraphs of [0155] to [0178] of the Japanese Patent Laid-Open Publication No. 2008-122932, and those of the acetylene alcohol in the paragraphs of [0179] to [0182] of the same. Besides, a compound that can release an amine by an acid may be added; and thus, for example, compounds having a carbamate group that are described in the Japanese Patent No. 3790649 may be used. Alternatively, a polymer-type quencher described in the Japanese Patent Laid-Open Publication No. 2008-239918 may also be added. This enhances the rectangularity of the resist after patterning by orientating thereof on the resist surface after coating. In addition, the polymer-type quencher has an effect to prevent the film loss of the pattern when the top coat for the immersion exposure is used and the rounding of the pattern top from occurring.

Meanwhile, the amount of the photo acid generator to be blended is preferably in the range of 0.01 to 100 parts by mass, especially in the range of 0.1 to 80 parts by mass, relative to 100 parts by mass of the base resin; and the amount of the organic solvent to be blended is preferably in the range of 50 to 10,000 parts by mass, especially in the range of 100 to 5,000 parts by mass, relative to 100 parts by mass of the base resin. The amount of the dissolution controlling agent to be blended is preferably in the range of 0 to 50 parts by mass, especially in the range of 0 to 40 parts by mass, relative to 100 parts by mass of the base resin; the amount of the basic compound to be blended is preferably in the range of 0 to 100 parts by mass, especially in the range of 0.001 to 50 parts by mass, relative to 100 parts by mass of the base resin; and the amount of the surfactant to be blended is preferably in the range of 0 to 10 parts by mass, especially in the range of 0.0001 to 5 parts by mass, relative to 100 parts by mass of the base resin.

As mentioned above, to the negative resist composition of the present invention a crosslinking agent may be added further. Specific example of the crosslinking agent that can be used in the present invention includes a melamine compound that is substituted by at least one group selected from a methylol group, an alkoxymethyl group, and acyloxymethyl group; a guanamine compound, a glycoluril compound or a urea compound, an epoxy compound, an isocyanate compound, an azide compound, and a compound having a double bond such as an alkenyl ether group. These may be used as an additive, though they may be introduced also as a pendant group into the polymer's side chain. Alternatively, a compound having a hydroxyl group may also be used as the crosslinking agent.

Furthermore, among the specific examples shown above, specific example of the melamine compound includes hexamethylol melamine, hexamethoxymethyl melamine, a hexamethylol melamine whose 1 to 6 methylol groups are methoxymethylated or a mixture of these methoxymethylated compounds, hexamethoxyethyl melamine, hexaacyloxymethyl melamine, and a hexamethylol melamine whose 1 to 6 methylol groups are acyloxymethylated or a mixture of these acyloxymethylated compounds.

Specific example of the guanamine compound includes tetramethylol guanamine, tetramethoxymethyl guanamine, a tetramethylol guanamine whose 1 to 4 methylol groups are methoxymethylated or a mixture of these methoxymethylated compounds, tetramethoxyethyl guanamine, tetraacyloxy guanamine, and a tetramethylol guanamine whose 1 to 4 methylol groups are acyloxymethylated or a mixture of these acyloxymethylated compounds.

Specific example of the glycoluril compound includes tetramethylol glycoluril, tetramethoxy glycoluril, tetramethoxymethyl glycoluril, a tetramethylol glycoluril whose 1 to 4 methylol groups are methoxymethylated or a mixture of these methoxymethylated compounds, and a tetramethylol glycoluril whose 1 to 4 methylol groups are acyloxymethylated or a mixture of these acyloxymethylated compounds. Specific example of the urea compound includes tetramethylol urea, tetramethoxymethyl urea, a tetramethylol urea whose 1 to 4 methylol groups are methoxymethylated or a mixture of these methoxymethylated compounds, and tetramethoxyethyl urea.

Specific example of the epoxy compound includes tris(2,3-epoxypropyl)isocyanurate, trimethylolmethane triglycidyl ether, trimethylolpropane triglycidyl ether, and triethylolethane triglycidyl ether.

Specific example of the isocyanate compound includes tolylene diisocyanate, diphenylmethane diisocyanate, hexamethylene diisocyanate, and cyclohexane diisocyanate.

Specific example of the azide compound includes 1,1'-biphenyl-4,4'-bisazide, 4,4'-methylidene bisazide, and 4,4'-oxybisazide.

Specific example of the compound having an alkenyl ether group includes ethylene glycol divinyl ether, triethylene glycol divinyl ether, 1,2-propanediol divinyl ether, 1,4-butanediol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, and sorbitol pentavinyl ether.

The amount of the crosslinking agent to be blended is in the range of 0 to 50 parts by mass, preferably in the range of 5 to 50 parts by mass, or more preferably in the range of 10 to 30 parts by mass, relative to 100 parts by mass of the base resin. These crosslinking agents may be used solely or as a mixture of two or more of them. If the amount is 5 or more parts by mass, sufficient enhancement of the resolution may be obtained; on the other hand, if the amount is 50 or less parts by mass, there is no risk of deterioration of the resolution caused by adhesion between the patterns.

As mentioned above, the negative resist composition of the present invention may be blended further with a basic compound.

The suitable basic compound is the one which can suppress the diffusion rate of an acid generated from the acid generator in the resist film. By blending the basic compound, the diffusion rate of the acid in the resist film can be suppressed, so that the resolution may be enhanced, the sensitivity change after exposure may be suppressed, dependence on the substrate and the environment may be lowered, and the exposure margin, pattern profile, and the like may be improved.

The negative resist composition of the present invention, such as for example a chemically amplified negative resist composition which contains an organic solvent, a polymer shown by the general formulae (1) to (4), an acid generator, and a basic compound, may be suitably used not only for the lithography in formation of a semiconductor circuit, but also for patterning of the interlayer insulation film, for formation of a mask circuit pattern, for a micromachine, for formation of a thin film magnet head circuit, and the like.

When the negative resist composition of the present invention is used for manufacturing of various integrated circuits, heretofore known lithography technologies may be used without any particular restriction.

That is, by using the negative resist composition of the present invention, a pattern may be formed on a semiconductor substrate, a mask substrate, or the like by the process which includes a step of applying the negative resist composition onto a substrate, after a heat treatment thereof, a step of exposing thereof to a high energy beam, and a step of development thereof by using a developer. Moreover, by carrying out the baking after patterning, the pyruvic acid residue is decomposed, so that the carboxyl group can be eliminated by the decarbonation reaction. By so doing, the stability of the film under the environment of high temperature and high humidity may be enhanced.

As a matter of course, the development may be executed after the post-exposure heat treatment, not to speak of executing various operations including etching, removal of the resist, and cleaning.

For example, the negative resist composition of the present invention is applied onto a substrate for manufacturing of an integrated circuit (Si, $SiO_2$, SiN, SiON, TiN, WSi, BPSG, SOG, an organic anti-reflecting film, and so forth) or onto a substrate for manufacturing of a mask circuit (Cr, CrO, CrON, MoSi, and so forth) by an appropriate coating method such as a spin coating method, a roll coating method, a flow coating method, a dip coating method, a spray coating method, and a doctor coating method so as to give the coated film thickness of 0.1 to 2.0 μm. This is then prebaked on a hot plate in the temperature range of 60 to 150° C. and for the period of 10 seconds to 30 minutes, or preferably in the temperature range of 80 to 120° C. and for the period of 30 seconds to 20 minutes. Then, an intended pattern is obtained by exposing thereof directly or through a prescribed mask to a light source of a high energy beam selected from a UV beam, a far ultraviolet beam, an electron beam, an X-ray, an excimer laser beam, a γ-beam, and a synchrotron radiation ray. The exposure dose is in the range of about 1 to 200 $mJ/cm^2$, or preferably in the range of 10 to 100 $mJ/cm^2$; alternatively in the range of 0.1 to 100 μC, or preferably in the range of about 0.5 to 50 μC. Thereafter, the post-exposure bake (PEB) is executed on a hot plate in the temperature range of 60 to 150° C. and for the period of 10 seconds to 30 minutes, or preferably in the temperature range of 80 to 120° C. and for the period of 30 seconds to 20 minutes.

Thereafter, the development thereof is carried out by using a developer of an aqueous alkaline solution such as an aqueous solution of tetramethyl ammonium hydroxide (TMAH) with the concentration range of 0.1 to 5% by mass, or preferably 2 to 3% by mass and for the period of 3 seconds to 3 minutes, or preferably for 5 seconds to 2 minutes by a usual method such as a dip method, a puddle method, and a spray method. In this development, the exposed area is insoluble, whereas the unexposed area is soluble, so that an intended negative pattern is formed on the substrate. Meanwhile, in the resist composition of the present invention, among the high energy beams, an electron beam, a soft X-ray, an X-ray, a γ-beam, and a synchrotron radiation ray are most suitable for micropatterning.

After patterning by the development, baking is executed to eliminate the carboxyl group of the pyruvic acid by the decarbonation reaction. By the decarbonation reaction of the pyruvic acid, an aldehyde is generated; and this aldehyde reacts with an aromatic group that is present nearby, so that the crosslinking reaction takes place further. By so doing, not only the hydrophobicity in the film is enhanced, but also the crosslinking density becomes higher; and as a result, a tough permanent film can be formed. In this baking, the temperature is in the range of 150 to 300° C., or preferably in the range of 160 to 280° C.; and the time is in the range of 3 to 500 seconds, or preferably in the range of 5 to 300 seconds.

EXAMPLES

Hereunder, the present invention will be explained specifically by showing Synthesis Examples, Comparative Synthesis Examples, Examples, and Comparative Examples; however, the present invention shall not be restricted by the following Examples, etc.

Synthesis Example 1

Synthesis of Novolak Resin 1

A mixture of 6.3 g of 4-hydroxyphenyl pyruvic acid, 20.7 g of phenolphthalein, 15 g of aqueous formalin (concentration of 37% by mass), and 2 g of oxalic acid was stirred at 100° C. for 24 hours. After the reaction, the reaction mixture was dissolved in 500 mL of methyl isobutyl ketone; and then, they were washed thoroughly by water to remove the catalyst and metallic impurities. After the solvent was removed under reduced pressure, the evacuation was intensified to 2 mmHg at 150° C. to remove water and unreacted monomers, whereby the Novolak Resin 1 as shown below could be obtained.

Novolak Resin 1:
Molecular weight (Mw): 4,800
Dispersivity (Mw/Mn): 4.60

Novolak Resin 1

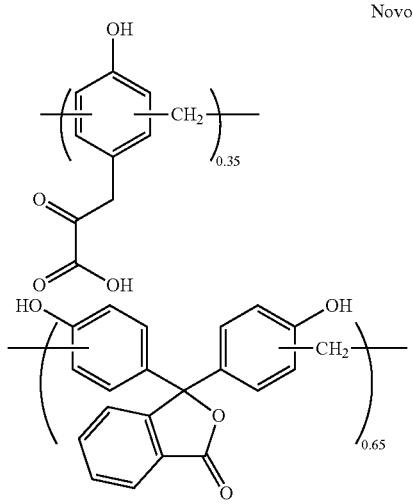

Synthesis Example 2

Synthesis of Novolak Resin 2

A mixture of 5.4 g of 4-hydroxyphenyl pyruvic acid, 14.0 g of 4,4'-(9H-fluorene-9-ylidene) bisphenol, 5 g of m-cresol, 15 g of aqueous formalin (concentration of 37% by mass), and 2 g of oxalic acid was stirred at 100° C. for 24 hours. After the reaction, the reaction mixture was dissolved in 500 mL of methyl isobutyl ketone; and then, they were washed thoroughly by water to remove the catalyst and metallic impurities. After the solvent was removed under reduced pressure, the evacuation was intensified to 2 mmHg at 150° C. to remove water and unreacted monomers, whereby the Novolak Resin 2 as shown below could be obtained.

Novolak Resin 2:
Molecular weight (Mw): 5,100
Dispersivity (Mw/Mn): 5.20

Novolak Resin 2

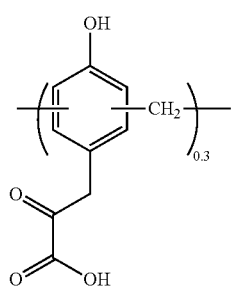

-continued

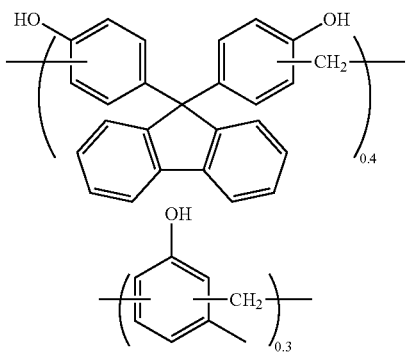

Synthesis Example 3

Synthesis of Novolak Resin 3

A mixture of 7.2 g of 4-hydroxyphenyl pyruvic acid, 21.5 g of phenol compound 1, 15 g of aqueous formalin (concentration of 37% by mass), and 2 g of oxalic acid was stirred at 100° C. for 24 hours. After the reaction, the reaction mixture was dissolved in 500 mL of methyl isobutyl ketone; and then, they were washed thoroughly by water to remove the catalyst and metallic impurities. After the solvent was removed under reduced pressure, the evacuation was intensified to 2 mmHg at 150° C. to remove water and unreacted monomers, whereby the Novolak Resin 3 as shown below could be obtained.

Novolak Resin 3:
Molecular weight (Mw): 8,600
Dispersivity (Mw/Mn): 5.90

Novolak Resin 3

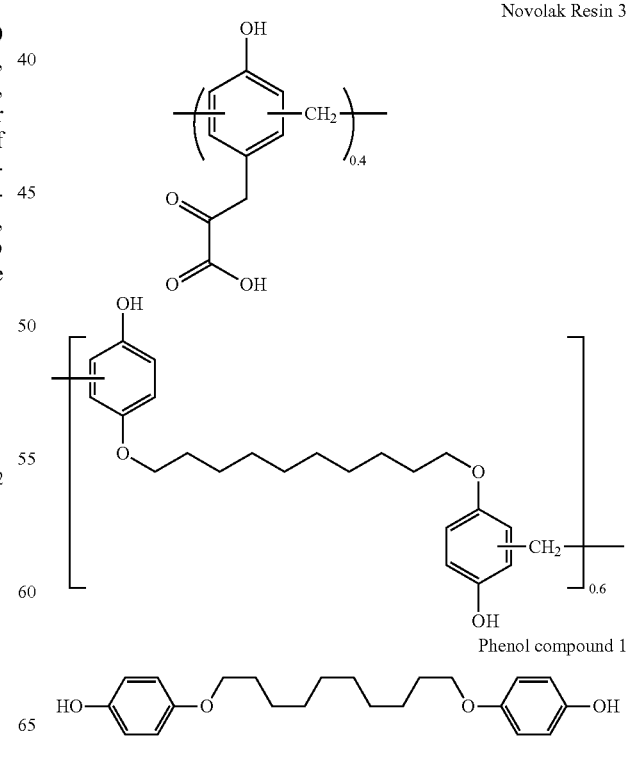

Phenol compound 1

Synthesis Example 4

Synthesis of Novolak Resin 4

A mixture of 5.8 g of 4-methoxyphenyl pyruvic acid, 7.4 g of 4,4'-hydroxy biphenyl, 8.2 g of phenol compound 2, 15 g of aqueous formalin (concentration of 37% by mass), and 2 g of oxalic acid was stirred at 100° C. for 24 hours. After the reaction, the reaction mixture was dissolved in 500 mL of methyl isobutyl ketone; and then, they were washed thoroughly by water to remove the catalyst and metallic impurities. After the solvent was removed under reduced pressure, the evacuation was intensified to 2 mmHg at 150° C. to remove water and unreacted monomers, whereby the Novolak Resin 4 as shown below could be obtained.

Novolak Resin 4:
Molecular weight (Mw): 4,100
Dispersivity (Mw/Mn): 4.20

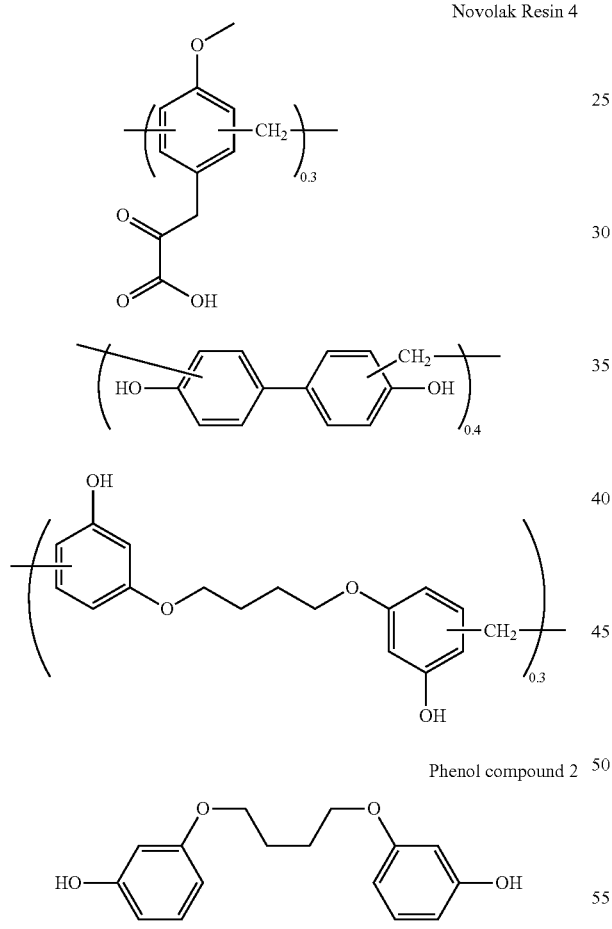

Novolak Resin 4

Phenol compound 2

Synthesis Example 5

Synthesis of Novolak Resin 5

A mixture of 5.8 g of 4-methoxyphenyl pyruvic acid, 100 g of bis(4-hydroxyphenyl) sulfone, 9.1 g of aromatic compound 1, 20 g of dioxane, and 2 g of oxalic acid was stirred at 100° C. for 24 hours. After the reaction, the reaction mixture was dissolved in 500 mL of methyl isobutyl ketone; and then, they were washed thoroughly by water to remove the catalyst and metallic impurities. After the solvent was removed under reduced pressure, the evacuation was intensified to 2 mmHg at 150° C. to remove water and unreacted monomers, whereby the Novolak Resin 5 as shown below could be obtained.

Novolak Resin 5:
Molecular weight (Mw): 5,100
Dispersivity (Mw/Mn): 5.20

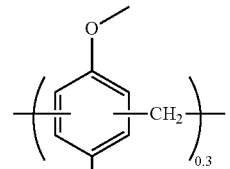
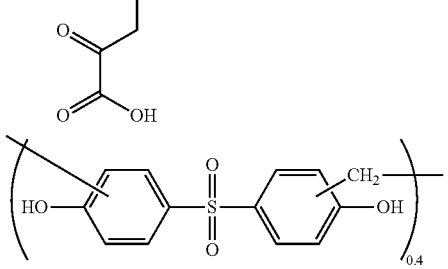
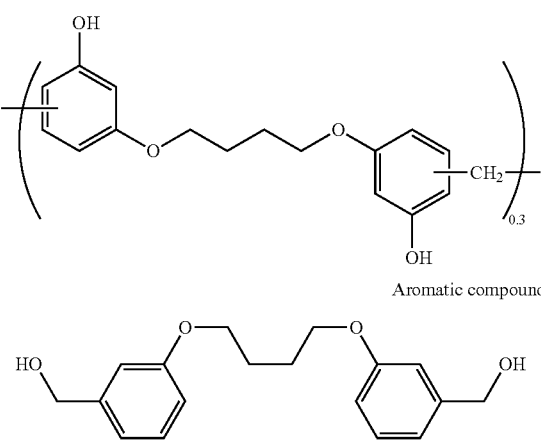

Novolak Resin 5

Aromatic compound 1

Synthesis Example 6

Synthesis of Novolak Resin 6

A mixture of 5.4 g of 4-hydroxyphenyl pyruvic acid, 22.6 g of phenol compound 3, 14.1 g of phenol red, 15 g of aqueous formalin (concentration of 37% by mass), and 2 g of oxalic acid was stirred at 100° C. for 24 hours. After the reaction, the reaction mixture was dissolved in 500 mL of methyl isobutyl ketone; and then, they were washed thoroughly by water to remove the catalyst and metallic impurities. After the solvent was removed under reduced pressure, the evacuation was intensified to 2 mmHg at 150° C. to remove water and unreacted monomers, whereby the Novolak Resin 6 as shown below could be obtained.

Novolak Resin 6:
Molecular weight (Mw): 8,600
Dispersivity (Mw/Mn): 4.30

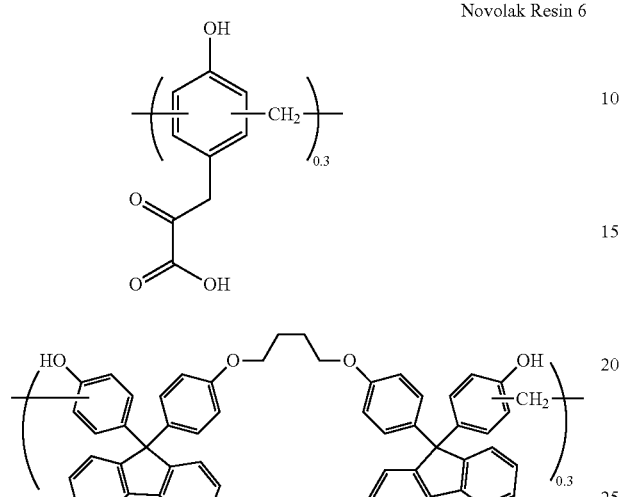

Novolak Resin 6

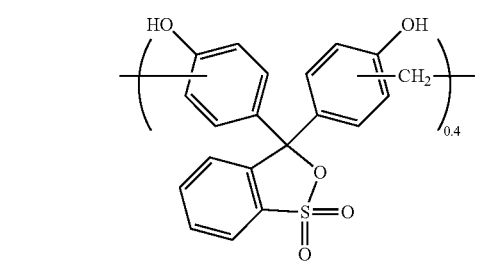

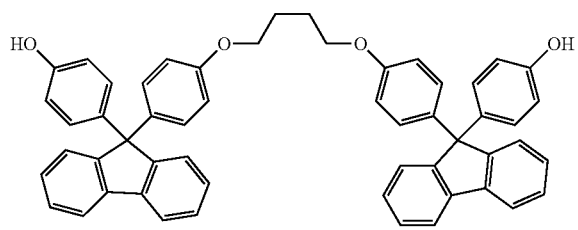

Phenol compound 3

Comparative Novolak Resin 1:
Molecular weight (Mw): 7,800
Dispersivity (Mw/Mn): 4.73

Comparative Novolak Resin 1

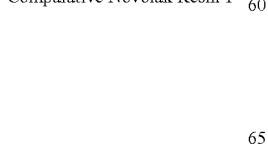

Comparative Novolak Resin 2:
Molecular weight (Mw): 6,800
Dispersivity (Mw/Mn): 4.46

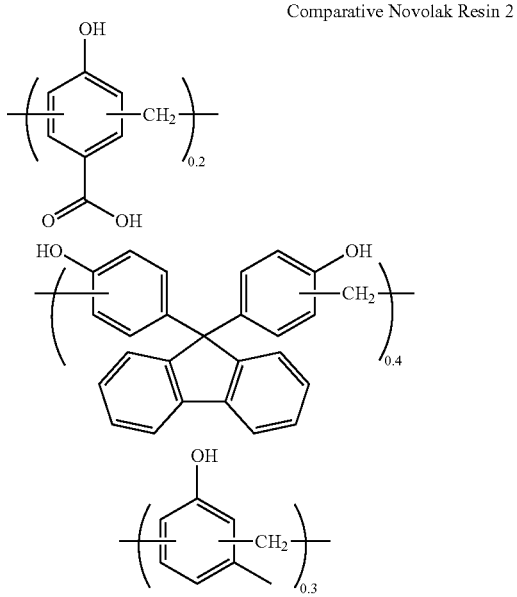

Comparative Novolak Resin 2

Preparation of Resists 1 to 11 and Comparative Resists 1 to 2:

Each of the Novolak Resins was dissolved with the composition shown in Table 1 in a solvent in which 100 ppm of FC-4430 (manufactured by Sumitomo 3M Ltd.) was dissolved as the surfactant. The resulting solution was filtrated through a filter with the size of 0.2 μm to obtain the negative resist composition.

The compositions in Table 1 are as following. Novolak Resins 1 to 6, and Comparative Novolak Resins 1 to 2: these were obtained by the Synthesis Examples as mentioned above.

Acid Generators: PAG 1 to 5 (See the Following Structural Formulae).

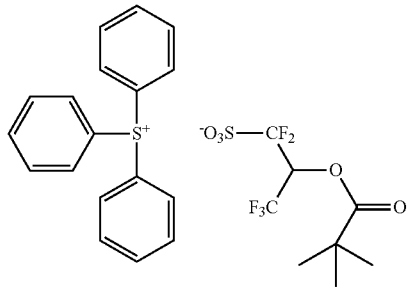

PAG 1

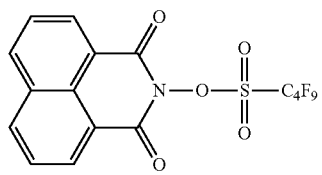

PAG 2

PAG 3
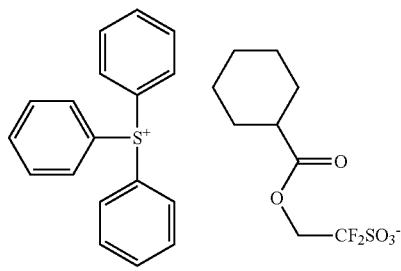
PAG 4
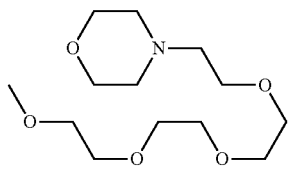
Basic Compounds: Quenchers 1 to 4 (See the Following Structural Formulae).
Quencher 1
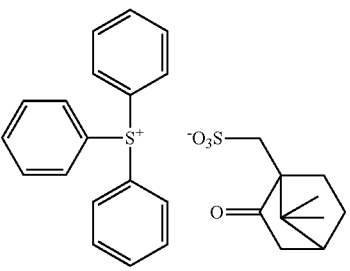
Quencher 2
PAG 5
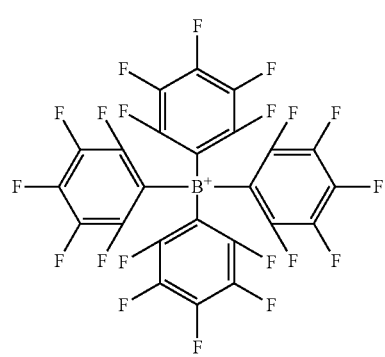
Quencher 3
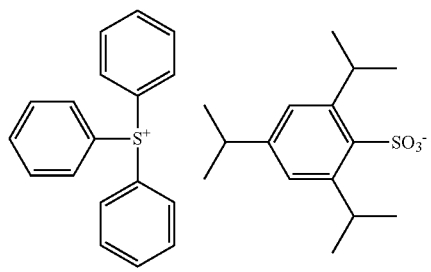
Quencher 4
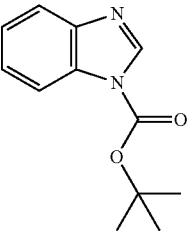
Crosslinking Agents: CR1 to CR3 (See the Following Structural Formulae).
CR 1
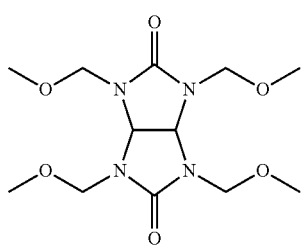

-continued

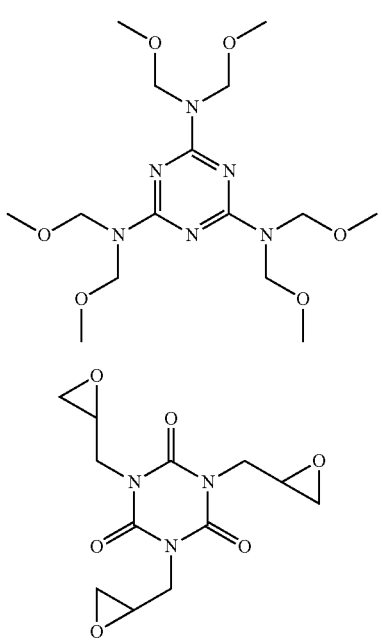

CR 2

CR 3

Organic Solvents:
PGMEA: propylene glycol methyl ether acetate
CyH: cyclohexanone
CyP: cyclopentanone Examples 1-1 to 1-11 and Comparative Examples 1-1 to 1-2 Evaluation of Electron Beam Drawing Each of the negative resist compositions (Resists 1 to 11 and Comparative Resists 1 to 2) was applied onto a Si substrate with the diameter of 6 inches (200 mm) by spin coating by means of CLEAN TRACK MARK V (manufactured by Tokyo Electron Ltd.), and then it was pre-baked on a hot plate at 110° C. for 90 seconds to obtain the resist film thickness of 200 nm. This was then subjected to the drawing by means of HL-800D (manufactured by Hitachi, Ltd.) with the HV voltage of 50 keV in a vacuum chamber.

Immediately after the drawing, it was subjected to the post-exposure bake (PEB) on a hot plate at 110° C. for 90 seconds by means of CLEAN TRACK MARK V (manufactured by Tokyo Electron Ltd.); and then, the puddle development was made with the aqueous TMAH solution with concentration of 2.38% by mass for 30 seconds to obtain the negative pattern.

The obtained resist pattern was evaluated as follows.

Taking the exposure dose to resolve the line-and-space with 0.12 μm at 1:1 as the resist sensitivity, the edge roughness with 120 nmLS and the cross section profile of the pattern were measured by the SEM.

The resist composition, the EB exposure sensitivity, and the resolution for each are shown in Table 1.

TABLE 1

| | Resist | Novolak Resin (parts by mass) | Acid generator (parts by mass) | Basic compound (parts by mass) | Cross-linking agent (parts by mass) | Organic solvent (parts by mass) | PEB Temp. (°C.) | Sensitivity (μC/cm²) | Resolution (nm) | Pattern profile |
|---|---|---|---|---|---|---|---|---|---|---|
| Example 1-1 | Resist 1 | Novolak Resin 1 (100) | PAG 1 (10) | Quencher 1 (1.0) | CR 1 (10) | PGMEA (1500) | 100 | 35.6 | 95 | Rectangular |
| Example 1-2 | Resist 2 | Novolak Resin 2 (100) | PAG 1 (10) | Quencher 1 (1.0) | CR 1 (10) | PGMEA (1000) CyH (500) | 100 | 35.6 | 95 | Rectangular |
| Example 1-3 | Resist 3 | Novolak Resin 3 (100) | PAG 1 (10) | Quencher 1 (1.0) | CR 2 (7) | PGMEA (1200) CyH (200) | 105 | 26.3 | 105 | Rectangular |
| Example 1-4 | Resist 4 | Novolak Resin 4 (100) | PAG 1 (10) | Quencher 1 (1.0) | CR 1 (12) | PGMEA (1200) CyH (200) | 105 | 33.0 | 100 | Rectangular |
| Example 1-5 | Resist 5 | Novolak Resin 5 (100) | PAG 1 (10) | Quencher 1 (1.0) | CR 1 (10) | CyH (500) CyP (1100) | 100 | 37.3 | 105 | Rectangular |
| Example 1-6 | Resist 6 | Novolak Resin 6 (100) | PAG 1 (10) | Quencher 1 (1.0) | CR 1 (10) | CyH (500) CyP (1300) | 100 | 33.0 | 100 | Rectangular |
| Example 1-7 | Resist 7 | Novolak Resin 1 (100) | PAG 1 (5) PAG 2 (5) | Quencher 2 (2.0) | CR 1 (10) | PGMEA (1500) | 100 | 35.6 | 100 | Rectangular |
| Example 1-8 | Resist 8 | Novolak Resin 1 (100) | PAG 3 (10) | Quencher 3 (2.0) | CR 1 (10) | PGMEA (1500) | 100 | 35.6 | 100 | Rectangular |
| Example 1-9 | Resist 9 | Novolak Resin 1 (100) | PAG 4 (10) | Quencher 4 (1.0) | CR 1 (10) | PGMEA (1500) | 100 | 35.6 | 100 | Rectangular |

TABLE 1-continued

| Resist | Novolak Resin (parts by mass) | Acid generator (parts by mass) | Basic compound (parts by mass) | Cross-linking agent (parts by mass) | Organic solvent (parts by mass) | PEB Temp. (°C.) | Sensitivity (μC/cm²) | Resolution (nm) | Pattern profile |
|---|---|---|---|---|---|---|---|---|---|
| Example 1-10 | Resist 10 | Novolak Resin 1 (100) | PAG 5 (15) | Quencher 1 (1.0) | CR 3 (14) | PGMEA (1500) | 100 | 45.8 | 100 | Rectangular |
| Example 1-11 | Resist 11 | Novolak Resin 1 (100) | PAG 1 (10) | Quencher 1 (1.0) | CR 1 (10) | PGMEA (1500) | 100 | 35.6 | 100 | Rectangular |
| Comparative Example 1-1 | Comparative Resist 1 | Comparative Novolak Resin 1 (100) | PAG 1 (10) | Quencher 1 (1.0) | CR 1 (10) | PGMEA (1500) | 100 | 28.5 | 150 | Rounding profile |
| Comparative Example 1-2 | Comparative Resist 2 | Comparative Novolak Resin 2 (100) | PAG 1 (10) | Quencher 1 (1.0) | CR 1 (10) | PGMEA (1500) | 100 | 33.6 | 180 | Rounding profile |

From the results shown in Table 1, it can be seen that Resists 1 to 11, resists of the present invention, have higher resolution and more excellent rectangular pattern profile as compared with Comparative Resists 1 to 2.

Examples 2-1 to 2-11 and Comparative Examples 2-1 to 2-2 Evaluation of the Environmental Resistance at High Temperature and High Humidity Each of the wafers having the formed pattern in Table 1 was baked at the temperature shown in Table 2 for the period of 120 seconds, and then it was allowed to stand under the environment of the temperature of 80° C. and the humidity of 100% for the period of 100 hours; and then, the pattern profile of the line-and-space with 200 nm was confirmed by the electron microscope. The results of them are shown in Table 2.

TABLE 2

| Example | Resist | Baking temperature (°C.) | Pattern profile |
|---|---|---|---|
| Example 2-1 | Resist 1 | 210 | Same as before the test |
| Example 2-2 | Resist 2 | 220 | Same as before the test |
| Example 2-3 | Resist 3 | 200 | Same as before the test |
| Example 2-4 | Resist 4 | 200 | Same as before the test |
| Example 2-5 | Resist 5 | 210 | Same as before the test |
| Example 2-6 | Resist 6 | 230 | Same as before the test |
| Example 2-7 | Resist 7 | 210 | Same as before the test |
| Example 2-8 | Resist 8 | 210 | Same as before the test |
| Example 2-9 | Resist 9 | 210 | Same as before the test |
| Example 2-10 | Resist 10 | 210 | Same as before the test |
| Example 2-11 | Resist 11 | 210 | Same as before the test |
| Comparative Example 2-1 | Comparative Resist 1 | 210 | Pattern-peeling off |

TABLE 2-continued

| Example | Resist | Baking temperature (°C.) | Pattern profile |
|---|---|---|---|
| Comparative Example 2-2 | Comparative Resist 2 | 210 | Pattern-peeling off |

From the results in Table 2, it was confirmed that the resist composition of the present invention has a high resolution, and that this resist is provided with the high environmental resistance at high temperature and high humidity because of the baking after patterning.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A negative resist composition, comprising an organic solvent and. as a base resin thereof, a novolak resin which contains repeating unit "a" shown by the following general formula (1) and repeating unit "b1" shown by the following formula (2),

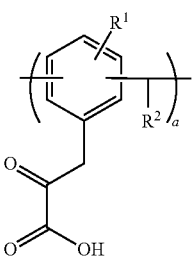

(1)

wherein $R^1$ represents a hydrogen atom, a hydroxy group, or any of a linear, a branched, or a cyclic alkyl group, alkoxy group, acyl group, acyloxy group, and alkoxy carbonyl group, these groups having 1 to 6 carbon atoms; and $R^2$ represents a hydrogen atom, or any of a linear, a branched, or a cyclic alkyl group having 1 to 6 carbon atoms, an alkenyl group having 2 to 10 carbon atoms, or an aryl group having 6 to 10 carbon atoms, wherein these groups may optionally contain a hydroxy group, an alkoxy group, an ether group, a thioether group, a carboxyl group, an alkoxy carbonyl group, and an acyloxy group; wherein, "a" is within the range of 0<a<1;

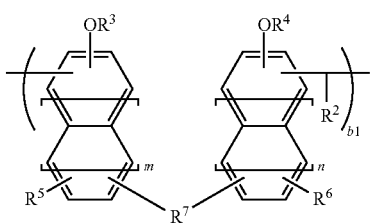

(2)

wherein $R^2$ represents the same meaning as before; $R^3$ and $R^4$ represent a hydrogen atom, or any of a linear, a branched, or a cyclic alkyl group or acyl group having 1 to 6 carbon atoms; and $R^5$ and $R^6$ represent a hydrogen atom, or any of a linear, a branched, or a cyclic alkyl group having 1 to 6 carbon atoms, wherein these groups may be optionally substituted by a halogen atom partially or all of them; $R^7$ represents a single bond, or any of a linear, a branched, or a cyclic alkylene group having 1 to 20 carbon atoms, or a linear, a branched, or a cyclic alkenylene group having 2 to 20 carbon atoms, or an arylene group having 6 to 20 carbon atoms, wherein these groups may optionally contain a nitrogen atom, a hydroxy group, a carboxyl group, an alkoxy carbonyl group, an acyloxy group, an ether group, an ester group, a thioether group, or a lactone ring; $R^5$ and $R^6$ may be optionally bonded to form an ether ring; wherein, "m" and "n" each represents 0 or 1; and "b1" is within the range of 0<b1<1.

2. The negative resist composition according to claim 1, wherein the novolak resin further contains repeating unit "b2" shown by the following formula (3),

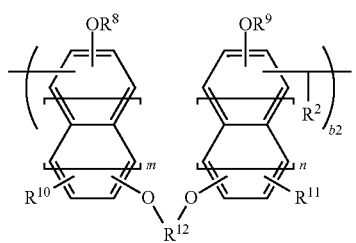

(3)

wherein $R^2$ represents the same meaning as before; $R^8$ and $R^9$ represent a hydrogen atom, or any of a linear, a branched, or a cyclic alkyl group or acyl group having 1 to 6 carbon atoms; $R^{10}$ and $R^{11}$ represent a hydrogen atom, or any of a linear, a branched, or a cyclic alkyl group having 1 to 6 carbon atoms; and $R^{12}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group; wherein, "m" and "n" each represents 0 or 1; and "b2" is within the range of 0<b2<1.

3. The negative resist composition according to claim 1, wherein the novolak resin further contains repeating unit "b3" shown by the following formula (4),

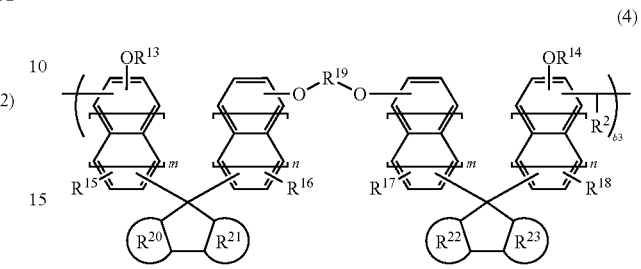

(4)

wherein $R^2$ represents the same meaning as before; $R^{13}$ and $R^{14}$ represent a hydrogen atom, or any of a linear, a branched, or a cyclic alkyl group or acyl group having 1 to 6 carbon atoms; $R^{15}$ to $R^{18}$ represent a hydrogen atom, or any of a linear, a branched, or a cyclic alkyl group having 1 to 6 carbon atoms; and $R^{19}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group; $R^{20}$ to $R^{23}$ represent a benzene ring or a naphthalene ring; wherein, "m" and "n" each represents 0 or 1; and "b3" is within the range of 0<b3<1.

4. The negative resist composition according to claim 2, wherein the novolak resin further contains repeating unit "b3" shown by the following formula (4),

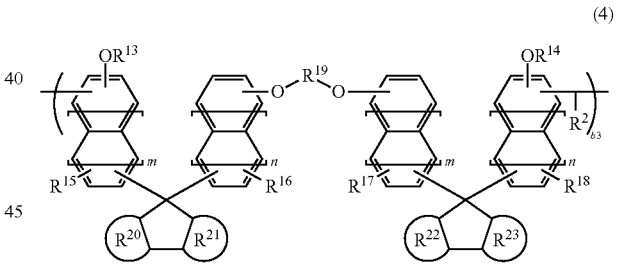

(4)

wherein $R^2$ represents the same meaning as before; $R^{13}$ and $R^{14}$ represent a hydrogen atom, or any of a linear, a branched, or a cyclic alkyl group or acyl group having 1 to 6 carbon atoms; $R^{15}$ to $R^{18}$ represent a hydrogen atom, or any of a linear, a branched, or a cyclic alkyl group having 1 to 6 carbon atoms; and $R^{19}$ represents any of a linear, a branched, or a cyclic alkylene group having 1 to 20 carbon atoms or alkenylene group having 2 to 20 carbon atoms, wherein these groups may optionally contain an ether group, a thioether group, and an ester group; $R^{20}$ to $R^{23}$ represent a benzene ring or a naphthalene ring; wherein, "m" and "n" each represents 0 or 1; and "b3" is within the range of 0<b3<1.

5. The negative resist composition according to claim 1, wherein weight-average molecular weight of the novolak resin is in the range of 400 to 500,000.

6. The negative resist composition according to claim 2, wherein weight-average molecular weight of the novolak resin is in the range of 400 to 500,000.

7. The negative resist composition according to claim 3, wherein weight-average molecular weight of the novolak resin is in the range of 400 to 500,000.

8. The negative resist composition according to claim 4, wherein weight-average molecular weight of the novolak resin is in the range of 400 to 500,000.

9. The negative resist composition according to claim 1, wherein the negative resist composition is a chemically amplified resist composition which contains an acid generator.

10. The negative resist composition according to claim 1, wherein the negative resist composition contains any one or more selected from a basic compound, a dissolution controlling agent, a surfactant, and a crosslinking agent.

11. A patterning process, wherein the patterning process comprises a step of applying the negative resist composition according to claim 1 onto a substrate, after a heat treatment thereof, a step of exposing thereof to a high energy beam, and a step of development thereof by using a developer.

12. The patterning process according to claim 11, wherein a step of baking is further included after a pattern is formed by the development by using a developer.

* * * * *